United States Patent [19]

Nishiguchi et al.

[11] Patent Number: 4,797,902
[45] Date of Patent: Jan. 10, 1989

[54] DIGITAL SIGNAL TRANSMISSION DEVICE

[75] Inventors: Masayuki Nishiguchi, Tokyo; Kenzo Akagiri, Kanagawa, both of Japan

[73] Assignee: Sony Corporation, Tokyo, Japan

[21] Appl. No.: 905,391

[22] PCT Filed: Dec. 26, 1985

[86] PCT No.: PCT/JP85/00721
§ 371 Date: Aug. 29, 1986
§ 102(e) Date: Aug. 29, 1986

[87] PCT Pub. No.: WO86/04198
PCT Pub. Date: Jul. 17, 1986

[30] Foreign Application Priority Data

Dec. 29, 1984 [JP] Japan ............................. 59-278501
Jul. 5, 1985 [JP] Japan ............................. 60-147938

[51] Int. Cl.$^4$ ............................................. H04B 14/04
[52] U.S. Cl. ...................................... 375/27; 375/34
[58] Field of Search ..................... 375/25, 27, 33, 34;
358/13, 133, 138, 260; 340/347 DD; 360/32;
332/11 R, 11 D

[56] References Cited

U.S. PATENT DOCUMENTS 4,396,937  8/1983  Reitmeier et al. ................ 358/138
4,633,325  12/1986  Usubuchi ............................ 358/13

Primary Examiner—Benedict V. Safourek
Attorney, Agent, or Firm—Hill, Van Santen, Steadman et al.

[57] ABSTRACT

A digital signal transmission device in which input digital signals consisting of a train of words that are continuous in time are formed into a block every after a predetermined number of words, and the block is transmitted through the so-called encode filter consists of a plurality of filters made up of an estimating unit of N-th degree and an estimating unit of a degree smaller than the N-th degree. Maximum absolute values in the blocks produced from the filters or maximum absolute values multiplied by a coefficients are compared with one another, and by selecting a filter which minimizes the value, the input digital signals can be transmitted through filters that provide the greatest efficiency for each of the blocks, e.i., that produce the least estimated errors.

6 Claims, 15 Drawing Sheets

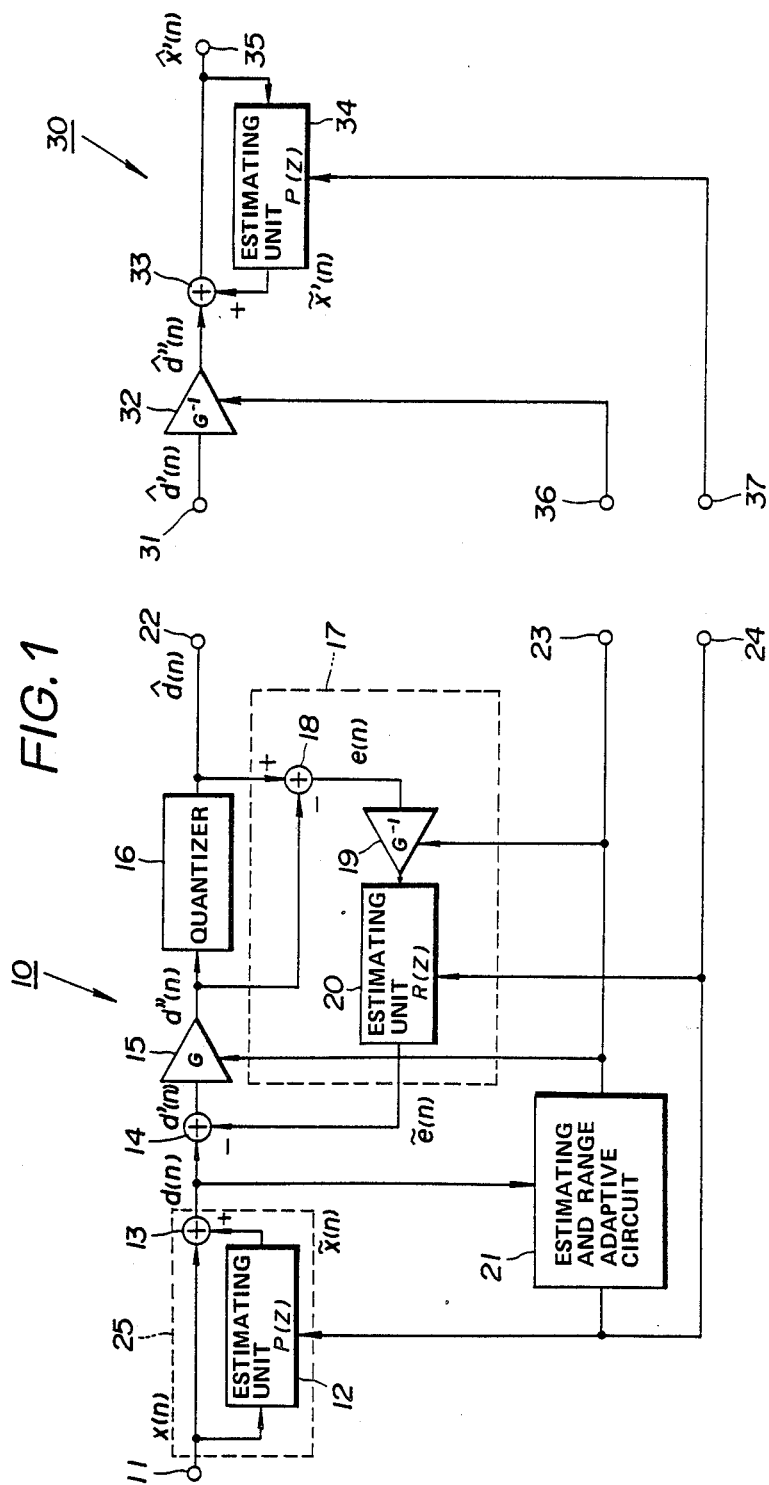

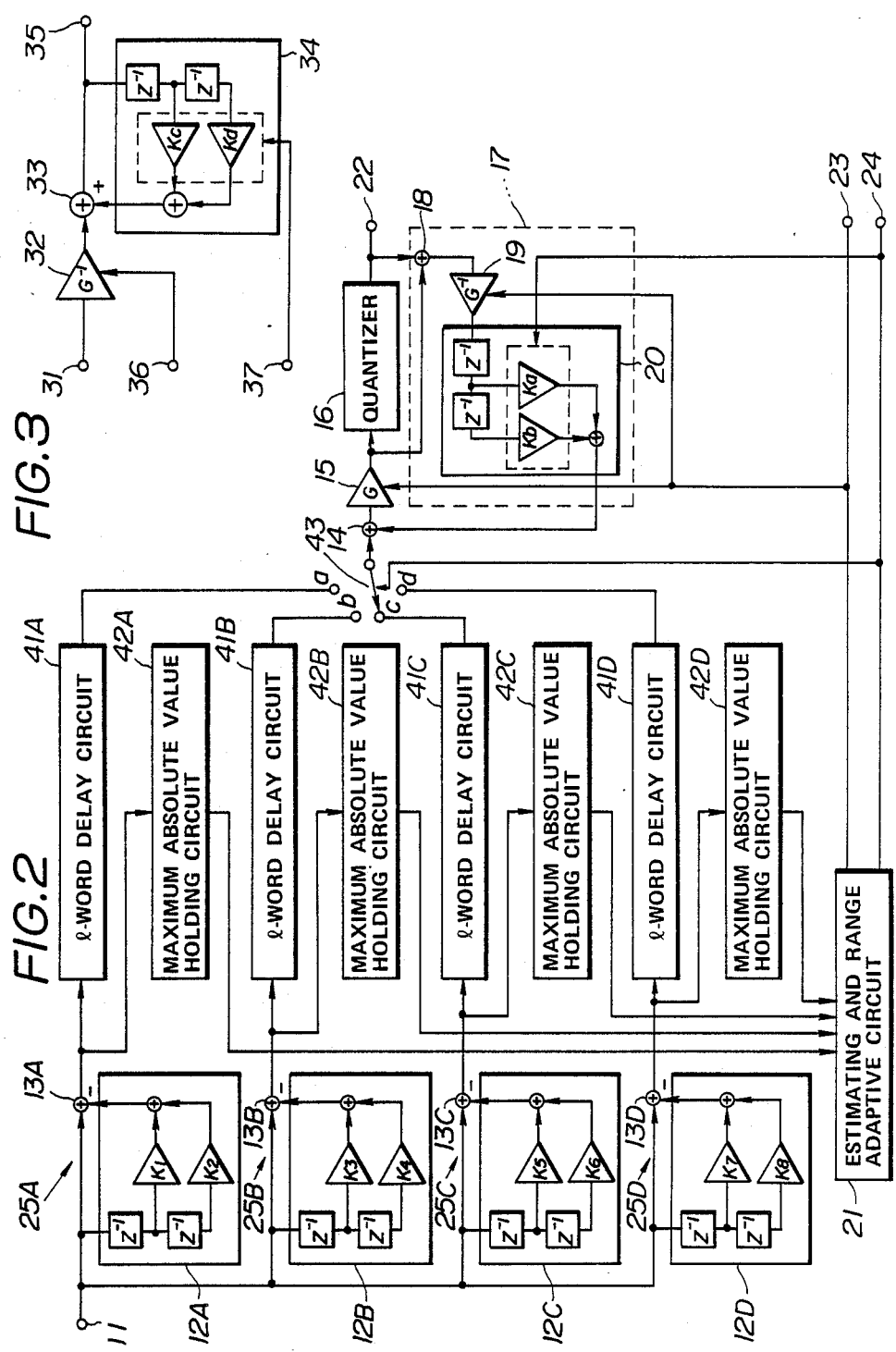

DIGITAL SIGNAL TRANSMISSION DEVICE

FIELD OF THE INVENTION

This invention relates to a digital signal transmission device in which digital siganls such as PCM signals are transmitted after they are formed into consecutive blocks each consisting of a predetermined number of words. More particularly, iot relates to a digital signal transmission device in which a companding processing is performed for each block for thereby reducing the transmission bit rate.

BACKGROUND

In recent years, audio or video analog signals are frequently processed by sampling, quantization and encoding into so-called pulse code modualtionor PCM signals before their transmission or recording and/or reproduction.

When transmitting or recording and/or reproducing these PCM signals, the practice commonly adopted for obtaining a bandwidth of, for example, 20 kHz and an S/N ratio of higher than about 90 dB, is to use a sampling frequency fs of 44.1 kHz and liner quantization at the rate of 16 bits per word. In this case, however, the rate of transmission is as high as 700 KBPS, or 700 k bits per second.

It is noted that, in digital signals obtained by A/D conversion of analog signals, such as audio or video signals, it is possible to compress the amount of information by taking advantage of the fact that these digital signals are prone to deviation from the statistic point of view and certain portions thereof are less critical insofar as the visual sense and/or accoustic sense is concerned. Thus it is known for example that deterioration in the signal quality occurs on very rare occasions even when these digital signals are subjected to differential or summation processing or to compression and expanding (companding) operations.

With this in view, it has been proposed in our copending Japanese Patent Application Nos. 97687 to 97689/1983, 163054/1983, 166267/1983 and 210382/1983, corresponding to U.S. application No. 700,817, filed 1/31/1985 (now abandoned), that the digital PCM signals, for example, are formed into a block at a predetermined time interval or every after a predetermined number of words and the signals of each block are subjected to predicting or estimating such as differential processing or companding before transmission or recording and/or reproduction.

According to these publications, reference data of at least one word, such as straight PCM data, are provided in each block. The differential data, for example, are sequentially summed or otherwise processed on the basis of these reference data so as to permit complete reconstruction of the original sampling data or straight PCM data in the block. The objective is mainly to minimize error propagation that is caused in general when transmitting differential processing data and to prevent error such as overshoot at the block boundaries from occurring when switching the estimating or companding operations for each block.

When an extremely high bit compression rate is used, e.g. when the 16-bit-per-word data is compressed to 4-bit-per-word data, each word of the reference data corresponds to 4 words of the data obtained after compression. Therefore, when it is desired to elevate the transmission or recording efficiency, it is preferred to effect data transmission or recording and/or reproduction without inclusion of the aforementioned reference data in the block.

However, the S/N ratio is not improved sufficiently when simply transmitting the differential output, or the unusual sound may be produced on occurrence of code error on the transmission channel or during recording and/or reproduction.

With this in views, it is an object of the present invention to provide a digital signal transmission device wherein deterioration of the S/N ratio or production of unusual sounds can be prevented while the transmission bit rate can be reduced to an extremely low level.

Disclosure of the Invention

The digital signal transmission device of the present invention is characterized in that the input digital signals are formed into a block every after a predetermined number of words along time axis and transmitted through a filter unit adapted for obtaining an estimated error for a signal for each block, or so-called differential processing filter unit, in that said unit is composed of a plurality of differential processing filters each consisting of an estimating unit of an N-th degree and an estimating unit of a degree lesser than the N-th degree, in that maximum asbolute values or peak values of the output from these differential processing filters in the block multiplied by a coefficient or coefficients are compared to one another, and in that the differential processing filter that will give the smallest value is selected for the block.

These differential processing filter may include a flat pass filter adapted for directly outputting input digital signals.

According to the digital signal transmission device having the above described features, it is the differential processing filter outputting the smallest of the respective peak values of the estimated error output from the plural differential processing filter for one block (or the maximum absolute value for the block) that is able to perform the most efficient differential processing of the input digital signals in the block. Data transmission at the greatest efficiency is achieved by selecting this differential processing filter. In addition, by comparing the peak values in the block multiplied by (or as it were weighted by) predetermined coefficients in dependence upon for example the number of degrees of the differential processing filters, flat-pass filters directly outputting input signals or low-degree filters rather than the high-degree filters are selected preferentially or more frequently for improving the S/N ratio at the time the high frequency range signals are introduced, or for preventing production of unusual noise on occurrence of the code error.

BRIEF DESCRIPTION OF THE DRAWINGS

FIG. 1 is a block circuit diagram showing a schematic structure of the overall system to which the digital signal transmission device of the present invention is applied:

FIGS. 2 and 3 are block circuit diagrams showing more detailed constructional examples of the encoder and decoder shown in FIG. 1;

BEST MODE FOR PRACTICING THE INVENTION

Figure 4:
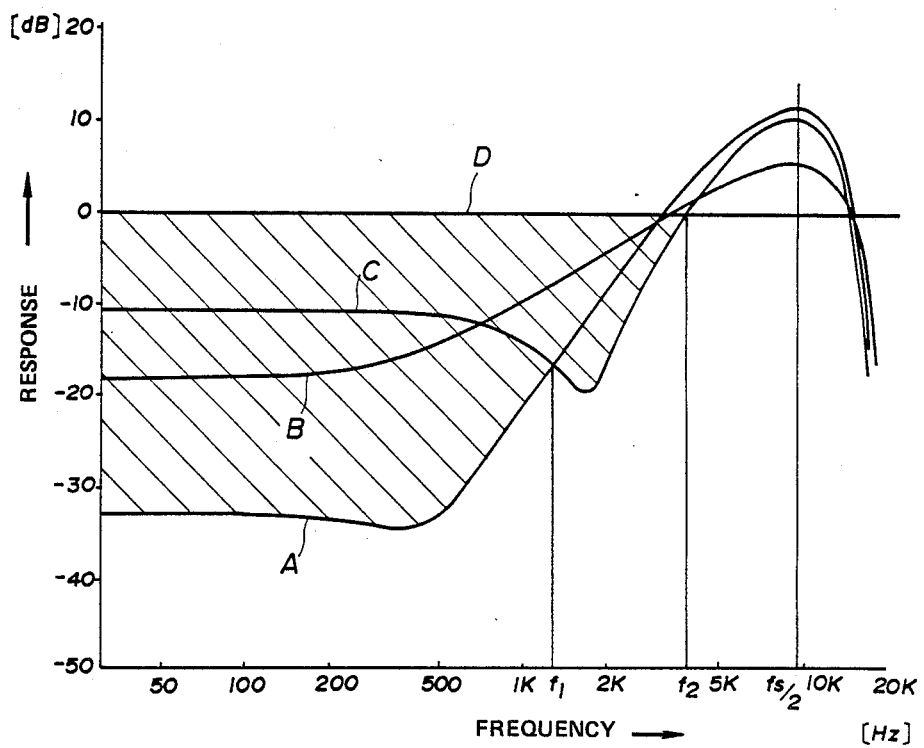
FIG. 4 is a chart showing frequency characteristics of the plural differential processing filters.

An embodiment of a digital signal transmission device of the present invention, when applied to an audio bit rate reduction system, is hereafter explained by referring to the accompanying drawings.

Diagrammatic Overall Structure

FIG. 1 shows in block circuit diagram the overall structure of the system. The system shown in FIG. 1 is made up of an encoder 10 of the recording side or more generally a transmitting side, and a decoder 30 of the reproducing side or more generally a receiving side. At an input terminal 11 of the encoder 10, there are supplied audio PCM signals $x(n)$ obtained by sampling of analog audio signals at a frequency $f_s$ followed by quantization and encoding.

These input signals $x(n)$ are supplied to a prediction unit or an estimating unit 12 and a summation unit 13. The estimated signals $\bar{x}(n)$ from the estimating unit 12 are transmitted to the summation unit 13 as subtractive signals. Thus, in the summation unit 13, the estimated signal $\bar{x}(n)$ is subtracted from the input signal $x(n)$ to produce as output an estimated error signal or, in a broad sense of the term, a differential output signal $d(n)$, that is, $$d(n) = x(n) - \bar{x}(n) \tag{1}$$

In general, the estimating unit 12 operates to calculate from a first-order combination of a p number of past input signals $x(n-p), x(n-p+1), \ldots, x(n-1)$, an estimated value $\bar{x}(n)$ is given as follows:

$$\bar{x}(n) = \sum_{k=1}^{p} a_k \cdot x(n-k) \tag{2}$$

where $a_k$ ($k=1, 2, \ldots, p$) denotes a coefficient. Thus the estimated error signal or (in the broad sense of the term) the differential output $d(n)$ is expressed follows:

$$d(n) = x(n) = \sum_{k=1}^{p} a_k \cdot x(n-k) \tag{3}$$

An FIR filter 25 adapted for obtaining the aforementioned estimated error output $d(n)$ is hereafter referred to as encode filter or differential processing filter.

According to the present embodiment, the input digital signals within a predetermined interval of time are formed into a block, that is, input data every after a predetermined number of words l are formed into a block and that encode filter or differential processing filter 25 occasionally showing the optimum characteristics is selected for each block. This can be achieved when a plurality of e.g. four, encode filters 25A, 25B, 25C and 25D having different characteristics are provided as shown in FIG. 2 and one of these filters 25A to 25D having the optimum characteristic is occasionally selected. However, in the general construction of the digital filters, a plurality of, e.g. four coefficients $a_k$ of the estimating unit 12 of the sole encode filter 25 shown in FIG. 1 may be stored in a coefficient memory and selectively switched among one another for achieving an operation substantially equivalent to the selection of one of the encode filters. In selecting the optimum filter for each block, the maximum absolute values or peak values in the block produced from the differential filters or the maximum absolute values or peak value multiplied by a coefficient are compared with one another in an estimating and range adaptive circuit 21. More precisely, the differential processing filter that will give the smallest of the maximum absolute values multiplied or not multiplied by the coefficient is selected as the optimum filter for the block. The information concerning the selection of the optimum filter is outputted as the mode selection information from the estimating and range adaptive circuit 21 so as to be transmitted to the estimating unit 12.

The differential output $d(n)$ as the aforementioned estimated error is transmitted via summation unit 14 to bit compression means consisting of a shifter 15 with a gain G and a quantizer 16, where it is subjected to compression or ranging processing in which the index part and the mantissa part in the floating point system correspond to the gain G and to the output from the quantizer 16, respectively. That is, the shifter 15 performs what is called range switching by shifting (i.e. arithmetically shifting) the digital binary, data by a number of bits corresponding to the aforementioned gain G. The quantizer 16 performs a re-quantization in which a predetermined number of bits are taken out from these bit-shifted data. A noise-shaping circuit 17 (noise shaper) performs what is called an error feedback operation according to which an error between the output and the input of the quantizer 16, that is, the so-called quantizing error, is obtained at summation unit 18 and transmission via shifter 19 with the gain of $G^{-1}$ to the estimating unit 20 and the estimated quantizing error signal is fed back as the subtractive signal to the summation unit 14. On the basis of the maximum absolute value in the block of the differential output from the filter of the selected mode, the estimation and range adaptive circuit 21 outputs a range information, which information is transmitted to the shifters 15, 19 for determining the gains G and $G^{-1}$ for each block. As for the estimating unit 20, the aforementioned mode information from the estimating and range adaptive circuit 21 is supplied to the unit 20 for determining its characteristics.

Thus the output d'(n) from the summation unit 14 becomes equal to the aforementioned differential output d(n) less the estimated quantizing error signal $\tilde{e}(n)$ from the noise shaper 17 and hence may be given as follows:

$$d'(n) = d(n) - \tilde{e}(n) \quad (4)$$

while the output d''(n) from the shifter with the gain G is given as follows:

$$d''(n) = G \cdot d'(n) \quad (5)$$

When the quantizing error e(n) produced in the course of the quantization is expressed as e(n), the output $\hat{d}(n)$ from the quantizer 16 is given as follows:

$$\hat{d}(n) = d''(n) + e(n) \quad (6)$$

with the quantization error e(n) being taken out at the summation unit 18 of the noise shaper 17 and supplied via shifter 19 of the gain $G^{-1}$ to the estimating unit 20 where a first-degree combination is taken of the past r number of input signals to produce the estimated quantizing error signal $\tilde{e}(n)$ which is expressed as follows:

$$\tilde{e}(n) = \sum_{k=1}^{r} \beta_k \cdot e(n-k) \cdot G^{-1} \quad (7)$$

The equation (7) is similar in form to the equation (2). Thus the estimating units 12, 20 are finite impulse response filters or FIR filters having system functions P(Z) and R(Z) are given as follows:

$$P(z) = \sum_{k=1}^{p} \alpha_k z^{-k} \quad (8)$$

$$R(z) = \sum_{k=1}^{r} \beta_k z^{-k}$$

respectively.

From these equations (4) to (7), the output $\hat{d}(n)$ from the quantizing unit 16 is given as follows:

$$\hat{d}(n) = G \cdot (d(n) + e(n)) + e(n) \quad (9)$$
$$= G \cdot d(n) + e(n) - \sum_{k=1}^{r} \beta_k \cdot e(n-k)$$

Substituting the formula (3) in d(n) of the formula (9), $$\hat{d}(n) = G\left\{x(n) - \sum_{k=1}^{p} \alpha_k \cdot x(n-k)\right\} + e(n) - \quad (10)$$
$$\sum_{k=1}^{r} \beta_k \cdot e(n-k)$$

This output $\hat{d}(n)$ is taken at an output terminal 22. If the z-transformation of x(n), e(n) and $\hat{d}(n)$ is expressed as X(z), E(z), and $\hat{D}(z)$, respectively, $$\hat{D}(z) = G \cdot X(z)\left(1 - \sum_{k=1}^{p} \alpha_k \cdot z^{-k}\right) + \quad (11)$$
$$E(z)\left(1 - \sum_{k=1}^{r} \beta_k \cdot z^{-k}\right)$$
$$= G \cdot X(z)(1 - P(z)) + E(z)(1 - R(z))$$

Meanwhile, the aforementioned range information from the estimating and range adaptive circuit 21 is taken at an output terminal 23 whilst the aforementioned mode selection information is taken at an output terminal 24.

An output $\hat{d}(n)$ from an output terminal 22 of the encoder 10 is transmitted to an input terminal 31 of the receiving or reproducing side decoder 30 or a signal $\hat{d}'(n)$ obtained after recording and reproduction is supplied to the same output terminal. This input signal $\hat{d}'(n)$ is sent to the summation unit 33 through shifter 32 with a gain of $G^{-1}$. The output $\hat{x}'(n)$ from the summation unit 33 is transmitted to an estimating unit 34 from which an estimated signal x'(n) is outputted and supplied to the summation unit 33 where it is added to the output d''(n) from the shifter 32. The output thus obtained after the addition is outputted at an output terminal 35 as the decode output $\hat{x}'(n)$.

The aforementioned range information and mode selection information that is outputted at the output terminals 23, 24 of the encoder 10 and transmitted or recorded and reproduced are entered into input terminals 36, 37 of the decoder 30, respectively. The range information from the input terminal 36 is transmitted to shifter 32 for determining the gain $G^{-1}$ while the mode selection information from the input terminal 37 is transmitted to the estimating unit 34 for determining estimation for determining estimation characteristics. In determining the estimation characteristics of the estimating unit 34, those equal to the characteristics of the estimating unit 12 of the encoder 10 are selected.

In the above described construction of the decoder 30, the output $\hat{d}''(n)$ from the shifter 32 is given as follows:

$$\hat{d}''(n) = \hat{d}'(n) \cdot G^{-1} \quad (12)$$

whereas the output x(n) from the summation unit 33 is given follows:

$$\hat{x}'(n) = \hat{d}''(n) + \tilde{x}'(n) \quad (13)$$

Since the estimating unit 34 is selected to have the characteristics equal to those of the estimating unit 12 of the encoder 10, we obtain an equation $$\tilde{x}'(n) = \sum_{k=1}^{p} \alpha_k \cdot \hat{x}'(n-k)$$

such that, from the equations (12) and (13), the following equation (14) is derived.

$$\hat{x}'(n) = G^{-1} \cdot \hat{d}'(n) + \sum_{k=1}^{p} \alpha_k \cdot \hat{x}'(n-k) \quad (14)$$

With $\hat{X}'(z)$ and $\hat{D}'(z)$ being z-transformation of $\hat{x}'(n)$ and $\hat{d}(n)$, respectively, we obtain $$\hat{X}(z) = G^{-1} \cdot \hat{D}'(z) + \sum_{k=1}^{p} a_k \cdot \hat{X}(z) \cdot z^{-k} \quad (15)$$
$$= G^{-1} \cdot \hat{D}'(z) + P(z) \cdot \hat{X}(z)$$

Hence, $$\hat{X}(z) = \frac{G^{-1} \cdot \hat{D}'(z)}{1 - P(z)} \quad (16)$$

Assuming that there is no error in the transmission channel or recording medium, and also assuming that $\hat{D}'(z) = \hat{D}(z)$, the following equation is derived from the equations (11) and (16).

$$\hat{X}(z) = \hat{X}(z) + G^{-1} \cdot E(z) \frac{1 - R(z)}{1 - P(z)} \quad (17)$$

It is apparent from the equation (17) that the noise reduction effect equal to $G^{-1}$ may be obtained for the quantizing error of $E(z)$ and that the noise spectrum distribution $N(z)$ appearing in the decoder output is given follows:

$$N(z) = E(z) \frac{1 - R(z)}{1 - P(z)} \quad (18)$$

In the above system, the gain G operating to normalize the signal by value related to the aforementioned maximum absolute value in the block has frequency characteristics. For simplifying the description, the value G is expressed as the product of two elements $G_p$ and $G_f$ such that $$G = G_p \cdot G_f \quad (19)$$

In this formula (19), $G_p$ represents the estimated gain obtained by the aforementioned processing with the estimating filter, that is, an increase in the instantaneous S/N ratio, and $G_f$ the amount of gain control by the ranging operation, that is, an increase in the dynamic range. Thus, $G_p$ does not depend on the input signal level but depends on the input signal frequency, whilst $G_f$ does not depend on the input signal frequency but depends on the input signal level. On the other hand, $G_p$ has an increase in the S/N ratio equal to $$G_p = \frac{X(z)}{D(z)} = \frac{1}{1 - P(z)} \quad (20)$$

while it has a frequency response represented by the reverse function of the transfer function $1 - P(z)$ of the difference processing filter used for obtaining the estimated error. The noise spectrum at this time is as shown by the equation (18). As for the term $G_f$, it correponds to the quasi-instantaneous compansion for which the signal is normalized by the maximum absolute value in the block for the particular mode selected for each block.

In the above described system, the gist of the present invention resides in that the differential processing filter consisting of an estimating unit 12 and a summation unit 13 and adapted for obtaining an estimated error output or differential output consists of a plurality of filters made up of an estimating unit of an N-th degree and an estimating unit of a degree smaller than the N-th degree. The maximum absolute values in the block produced from the filters or the maximum absolute values multiplied by a coefficient are compared with one another and the differential processing filter that minimizes the value is selected. The differential processing filters include those directly outputting straight PCM data.

Practical Constructional Example

FIG. 2 shows a more practical constructional example of the audio bit rate reduction system shown in FIG. 1. In FIG. 2, the parts or components same as those shown in FIG. 1 are indicated by the same reference numerals.

In FIG. 2, the estimating unit 12 is made up of a plurality of, e.g. four estimating units 12A, 12B, 12C and 12D. The estimated output from these estimating units 12A to 12D are transmitted as subtrative signals to the summation units 13A to 13D and subtracted from the original input signals. That is, four differential processing filters are formed by each four estimating units 12A to 12D and summation units 13A to 13D for obtaining estimated error signals over four channels. It will be noted that the estimating units 12A to 12D are apparently of second-degree is structure, with the unit 12A to 12D having $k_1$, $k_2$; $k_3$, $k_4$; $k_5$, $k_6$ and $k_7$, $k_8$ as coefficients $a_1$, $a_2$, respectively. However, by setting at least one of the coefficients of the desired estimating unit so as to be equal to zero, these units may have estimation characteristics of the degree not larger than the first degree. Therefore, whilst the aforementioned four differential processing filters are apparently designed to take the differential of the second degree, it is also possible that a desired differential processing filter has the characteristics of taking the differential of not higher than the first degree, including those of outputting the straight PCM data.

The outputs from these differential processing filters, that is, the output from the summation units 13A to 13D are transmitted to 1-word delay circuits 41A to 41D and maximum absolute value holding circuits 42A to 12D, with the outputs from the 1-word delay circuits 41A to 41D being transmitted to respective selected terminals a to d of the mode changeover switching circuit 43. Since each block is composed of 1 words, one-block delay occurs in the 1-word delay circuits 41A to 41D. During the time the delay is caused to occur, the aforementioned maximum absolute values in the block are sensed in the respective holding circuits 42A to 42D. These maximum absolute values in the block are transmitted to the estimating and range adaptive circuit 21 where they are compared to one another and those circuits that will minimize the value are selected. The maximum absolute values in the block may be multiplied by a predetermined coefficient for so-called weighting after which the thus weighted values are compared with one another. The estimating and range adaptive circuit 21 outputs a mode selecting information that is used for selecting that one of the one-block data from the differential processing filters that will minimize the maximum absolute value in the block. This mode selection information is transmitted to the changeover switch circuit 43 to effect switching connection to that delay circuit that will output the thus-selected oneblock data. The output from the changeover switching circuit 43 is transmitted to the summation unit 14. The aforementioned mode selection information from the estimating and range adaptive circuit 21 is also transmitted to the estimating unit 20 and to the output terminal 24. In order to render the noise apperaing for example at the decoder output (see the equation (18)) white, the estimating unit 20 is so selected as to have the properties equal to those of the selected one of the estimating units 12A to 12D. That is, the estimating unite 20 also has the construction of the estimating unit of the second degree and the coefficients $K_a K_b$ corresponding to the coefficients $\beta_1$, $\beta_2$ are selected to be equal to that one of the coefficient sets $K_1$, $K_2$; $K_3$, $K_4$; $K_5$, $K_6$ and $K_7$, $K_8$ of the estimating units 12A to 12D of the differential processing filter that is designated by the above described mode selecting operation.

In the practical example of the decoder 30 shown in FIG. 3, the estimating unit 34 has the structure of the apparent second degree in conformity to the estimating units 12A to 12D of FIG. 2 and, as the coefficient $k_C$, $k_D$, one of the coefficient sets $k_1$, $k_2$; $k_3$, $k_4$; $k_5$, $k_6$ and $k_7$, $k_8$ of the aforementioned estimating units 12A to 12D is selected in dependence upon the mode selecting information supplied from the input terminal 37.

The construction of FIGS. 2 and 3 is otherwise the same as that of FIG. 1 described hereinabove and the corresponding description is omitted for clarity.

It is to be noted that, as the hardware setup of the encoder 10 or decoder 30, it is not necessary to provide for example a plurality of estimating units 12A to 12D, but a plurality of coefficients of a sole estimating units can be time-sharingly used in rotation. As an alternative, the encoder 10 and the decoder 30 in their entirety may be inplemented by using a software artifice and by a system including a digital signal processor (DSP) or a memory unit.

First Embodiment

A first embodiment of the present invention will be described hereafter in detail, wherein the sampling frequency $f_s$ of the audio PCM signal supplied to the input terminal 11 is equal to 18.9 kHz, the number 1 of 16-bit words in one block is 28 and each word is re-quantized at the quantizer 16 into 4-bit-per-word data. The coefficient sets $k_1$, $k_2$ to $k_7$, $k_8$ of the estimating units 12A to 12D of the second degree are so selected that, for example, $12A: K_1 = 1.8426, K_2 = -0.8649$ $12B: K_3 = 0.875, K_4 = 0$ $12C: K_5 = 1.5155, K_6 = -0.81$ $12D: K_7 = 0, K_8 = 0$ At this time, the transfer functions $1-P(z)$ of the differential processing filters of the respective modes may be written as follows:
A: $1 - 1.8426z^{-1} + 0.8649z^{-2}$
B: $1 - 0.875z^{-1}$
C: $1 - 1.5155z^{-1} + 0.81z^{-2}$
D: $1$
with the frequency characteristics of these differential processing filters being as shown by the curves A to D in FIG. 4.

Thus it is the differential processing filter shown by the characteristic curve A (consisting of the estimating unit 12A and the summation unit 13A) that corresponds to the differential PCM mode of the second degree and that provides a marked increase in the estimated gain in the low frequency range, that is, in the instantaneous S/N ratio. The differential processing filter shown by the characteristic curve B (estimating unit 12B and summation unit 13B) is a filter corresponding to the differential PCM mode of the first degree while the differential processing filter shown by the characteristic curve C (estimating unit 12C and summation circuit 13C0 provides a high estimated gain for the mid frequency range. The differential processing filter consisting of the estimating unit 12D and the summation unit 13D has the coefficients $k_7$, $k_8$ both equal to zero so that it has no frequency response but only has so-called flat pass characteristics with the reference gain equal to unity, thus corresponding to the straight PCM mode, as indicated by the characteristic curve D shown in FIG. 4.

Figure 5:
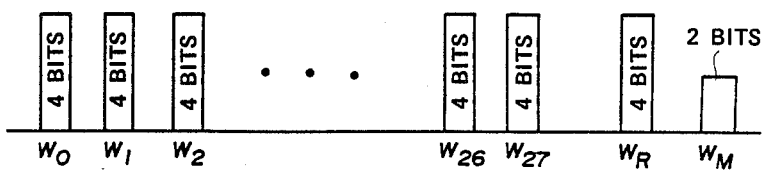
FIG. 5 is a chart showing an example of the transmission word in one block.

FIG. 5 shows a practical example of the word format transmitted as one block. Thus there occurs blockwise transmission of 28 audio data words $W_0$ to $W_{27}$, with each word consisting of 4 bits after re-quantization, a so-called range information word $W_r$ indicating the take-out position of the 4 bits at the time of blockwise re-quantization from 16 bits per word to 4 bits per word, and a mode selecting information $W_M$ indicating which of the four modes associated with the four filters has been selected. Thus the mean bit number per each transmitted audio data word is $$(4 \times 28 + 4 + 2) \div 28 = 4.214 \text{ bits.}$$

Referring to FIG. 4, when the input signal is a single sinusoidal wave signal, the filter of the characteristic curve A is selected for the frequencies of from $f_1$ to $f_2$, while the filters of the characteristic curves C and D are selected for the frequency range of from $f_1$ to $f_2$ and for the frequency range of from $f_2$ to about $f_s/2$, respectively. It is to be noted that the input signal frequency of not lower than $f_s/2$ should be removed by the LPF (low pass filter) before A/D conversion for preventing so-called aliasing.

The frequency response of each filter thus selected represents an improvement in the estimated gain or in the instantaneous S/N ratio at the specificed frequency. The area indicated by hatching lines in FIG. 4 represents an increase in the instantaneous S/N ratio related to the frequency.

It is noted however that, since the actual audio input signals are composite spectrum signals, filter selection is not performed at the clear boundary in the above described manner, and the filter of the characteristic curve B is also frequently used.

The above described filter selection is based on direct comparison of the maximum absolute values or peak values in the block that are supplied from the filters of the respective modes. It is however possible to make a preferential selection of the filter of the lower degree or the filter outputting straight PCm data, by comparing the peak values of the respective modes in each block multiplied by predetermined coefficients. As examples of these coefficients, the peak value of the differential PCM data of the second degree from the filter of the characteristic curve A is multiplied by a coefficient 2, the peak value of the straight PCM data from the filter of the characteristic curve D is multiplied by a coefficient D7 and the peak values of the data from the remaining filter are not multiplied by any coefficient, or multiplied by a coefficient 1. These values thus multiplied are then compared to one another and the filter is elected taht will give the smallest of these values. Multiplication by these coefficients is tantamount to parallel shifting along the ordinate of the characteristic curves in the chart of FIG. 4, or to changing the response values. For example, multiplication of the peak value from the filter of the characteristic curve A by the coefficient 2 is tantamount to parallel upward shifting of the characteristic curve A by about 6 dB in FIG. 4. The result is that the filter switching frequencies $f_1$, $f_2$ are shifted towards the lower frequency side and the filter of the characteristic C is selected more frequently than that of the characteristic A, while the filter of the characteristics D is selected more frequently than that of the characteristics C. By thus using the lower degree filter more frequently, it is possible to suppress the effect of the code error taking place in the transmission channel.

At the decoder side, the one-block input audio data words $W_0$ to $W_{27}$ are subjected to a blockwise companding or to a blockwise ranging which is the reverse to that performed at the encoding side. This processing is performed at shifter 32 on the basis of the data of the aforementioned range information word $W_R$. The words thus processed are then subjected to blockwise back-estimating processing for reconstruction of the original straight PCM data. This processing is performed at the filter consisting of the summation circuit 33 and the estimating unit 34 on the basis of the data of the aforementioned mode selection information word $W_M$.

The system of the first embodiment provides for sound transmission with low to medium fidelity and makes it possible to transmit usual voice signals at an extremely low bit rate of 4,214 bits per word, or at a transmission bit rate of about 79.6 k bits per second per channel.

Second Embodiment

As an example of the system that provides for musical signal transmission with a medium to high fidelity, a second embodiment of the present invention is now explained in which three filters having estimation coefficients corresponding to the characteristic curves A, B and D in FIG. 4 are used and the sampling frequency $f_s$ is selected to be 37-8 kHz which is twice that used in the above described first embodiment. Other numerical figures and constructional features are similar to those used in the first embodiment.

Figure 6:
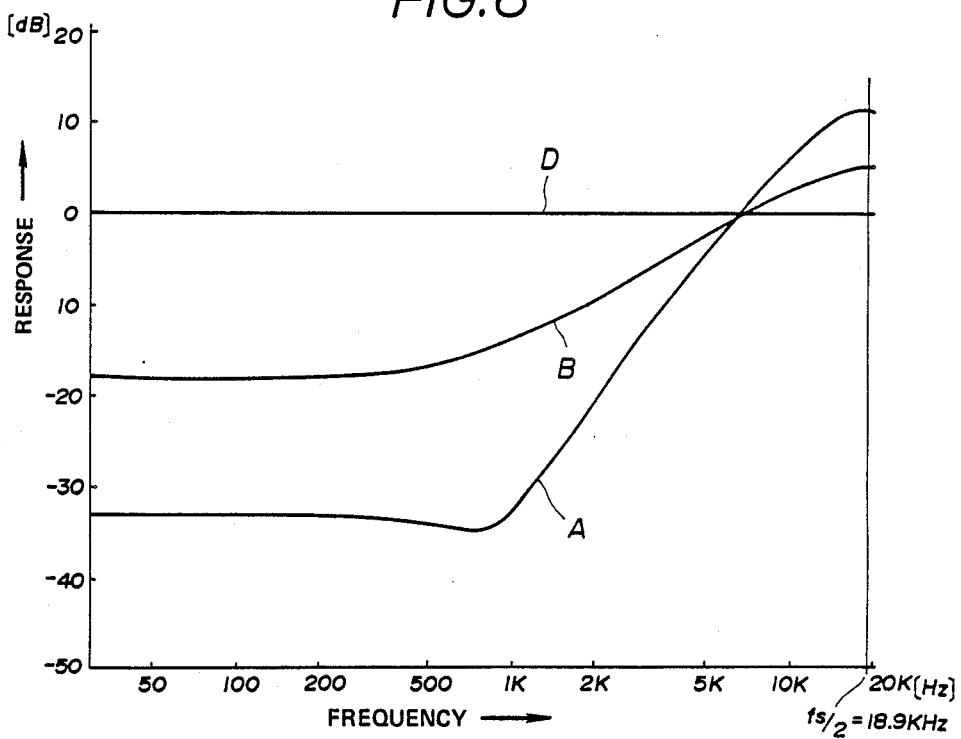
FIG. 6 is a chart showing frequency characteristics of the plural differential processing filters employed in another practical example.

Since the sampling frequency $f_s$ is now doubled, the frequency characteristics of the three filters as shown by the characteristic curves A, B and D shown in FIG. 6. Thus the characteristic curves D, B and A correspond to the straight PCM first degree differential and second degree differential modes, respectively.

It will be noted that the four bits at the predetermined bit positions are taken out when the 16-bit word is re-quantized at the quantizer 16 into the four bits. Since the range or bit shifter value is determined at the shifter 15 on the basis of the pre-noise-shaping data, that is, the peak value in the block of the selected mode, the feedback error from the noise shaper 17 is superimposed at the summation circuit 14, such that data overflow is most likely to occur at the time of inputting of the data that is close to the maximum value of the bits taken out at the time of ranging.

In order to prevent this, the peak value or the maximum absolute value in the block in the selected mode is previously multiplied by a predetermined coefficient $\gamma$ not lower than unity, the result of such multiplication being regarded as the peak value when determining the ranging position, that is, the taking-out position of the 4 bits from the 16 bits. Since the ranging position is now determined by the true peak value multiplied by the aforementioned coefficient $\gamma$, the aforementioned data overflow is not likely to occur by the error feedback from the noise shaper 17. The coefficient $\gamma$ is preferably set in accordance with the characteristics of the estimating unit of the selected mode.

In accordance with mode selection, the estimating unit 20 in the noise shaper 17 is selected so as to be similar in characteristics to the estimating units 12A to 12D adapted for differential processing, such that, at the time the straight PCM mode is selected, the coefficients $k_a$, $k_b$ of FIG. 2 are equal to zero and the effect of noise shaping is removed, the error feedback being zero, so that the coefficient $\gamma$ may be equal to unity. At the time of the first degree differential mode, the coefficient $\gamma \approx 1.14$ may be used, in consideration that the noise spectrum at the encoder output after the noise shaping coincides with the characteristic curve B in FIG. 6. At the time of the second degree differential mode, $\gamma \approx 1.33$ may be used, in consideration of the characteristic curve A in FIG. 6.

Figure 7:
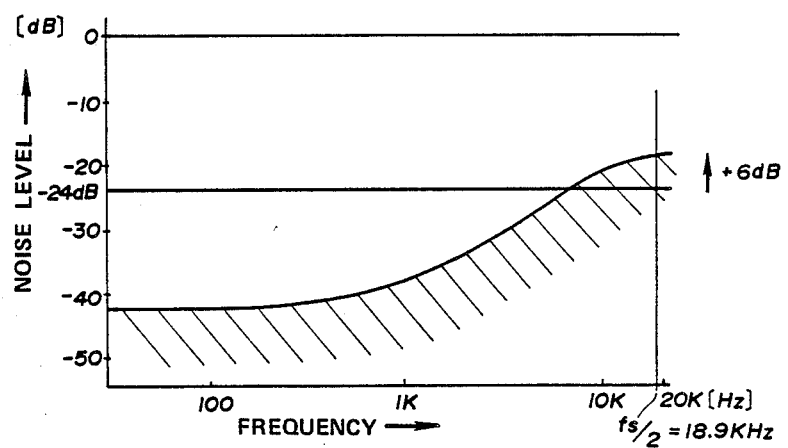
FIG. 7 is a chart showing spectrum distribution of the noise following the noise processing operation.

This, at the time the differential mode of the first degree is selected, the noise spectrum at the encoder output is as shown schematically in FIG. 7. With the instantaneous S/N ratio of approximately 24 dB at the time of re-quantization with 4 bits, the pre-noise-shaping noise level is $-24$ dB when the full scale, that is, the maximum level that can be expressed with four bits, is set to a reference value of D dB. Thus the noise level of the spectrum distribution as shown by the hatching lines in FIG. 7 is obtained after the noise shaping by the error feedback associated with estimation of the first degree. The result is that the noise level in the vicinity of the frequency of $f_s/2$ is raised by about 6 dB above the pre-noise-shaping level, thus possibly causing the aforementioned data overflow. Thus, with the amplitude distribution of the pre-noise-shaping quantization noise being random within $\pm\frac{1}{2}$ bit of the LSB of the 4 bits obtained by re-quantization, the maximum amplitude of the noise when taking the first degree differential of the input signal is $\pm 1$ LSB from the relation $$+\tfrac{1}{2}\text{LSB} - (-\tfrac{1}{2}\text{LSB}) = +1\text{ LSB}$$

$$-\tfrac{1}{2}\text{LSB} - (+\tfrac{1}{2}\text{LSB}) = -1\text{ LSB}$$

this maximum amplitude corresponding to the increase of about 6 dB in the vicinity of $f_s/2$. Thus the noise of $+6$ dB is transmitted even when there is no input signal and the noise peak value may exist at the position of approximately $-18$ dB in the vicinity of $f_s/2$ for the 0 dB indicating the full scale for the 4 bits. Since $-18$ dB is equal to about 0.125, data overflow due to noise shaping may be prevented from occuring by maintaining the signal peak value to $(1-0.125)$ or 0.875 times. Thus multiplication coefficient $\gamma$ for the peak value for determining the ranging position may be selected to be $1/0.875 = 1.14$.

As for the multiplication coefficient $\gamma$ for the peak value for determining the range position at the time of selection of the differential mode of the second degree, since the increase in the vicinity of $f_s/2$ of the characteristic curve A of FIG. 6 is about $+12$ dB, the peak value of the noise level may be situated at about $-12$ dB, with the 4-bit re-quantizing full scale being equal to 0 dB. Since $-12$ dB is about 0.25, data overflow due to noise shaping may be prevented form occurring by keeping the signal peak value to (1−0.25)=0.75, the coefficient γ being 1/0.75 or about 1.33.

Figure 8:
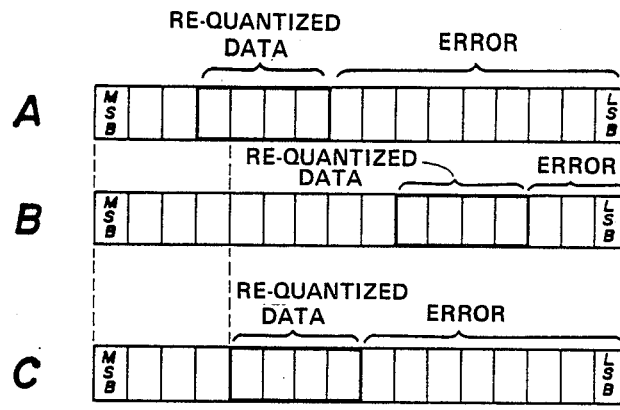
FIG. 8 is a chart for explaining the ranging position shifting at the time of re-quantization.

It is noted that, when the signal is changed rapidly so that the ranging position at the time of re-quantization is changed rapidly, the noise of the preceding block may be carried over to the next block, thus possibly causing data overflow. This is most likely to occur when the signal level is lowered rapidly in the vicinity of the block boundaries. At this time, the ranging position or the taking-out position of the 4 bits for re-quantization being shifted rapidly from the MSB side towards the LSB side in the 16 bits, as shown in FIGS. 8A and 8B, the error in the data of the preceding block (FIG. 8B) to cause overflow of the 4-bit data taken out by re-quantization. In term of the gain G of the shifter 15, this is tantamount to rapid increase thereof in the current block from the smaller value in the preceding block.

It is therefore perferred to allow the data overflow to occur and, on occurrence of data overflow, so-called clipping is performed for fixing the signal level to a maximum positive or negative value that can be expressed by the four re-quantization bits for preventing sign inversion while minimizing the occurrence of abnormal sounds.

Prior to this clipping, limitations are placed on the shifting of the bit take-out positions on the occasion of range decreasing or gain increasing, such that, as shown by FIG. 8C, the position shifted by one bit towards the LSB side flow the position of the preceding block is used as the bit take-out position or ranging position.

By thus limiting the shifting of the ranging position from the MSB side towards the LSB side of the original 16-bit data, it is possible to prevent rapid changes in the range while reducing the data overflow caused by noise shaping.

The operation of limiting the ranging position shifting is hereafter explained by taking one example of the differential mode of the second degree wherein data overflow is most likely to occur, that is, noise shaping is most acute.

During the time the differential mode of the second degree is selected, the noise spectrum distribution at the encoder output is shown by a curve similar to the characteristic curve A of FIG. 6, with the peak value of the noise in the vicinity of fs/z being about 4 times that before noise shaping, that is, it is raised by about +12 dB. Thus, with the full scale of the 4 re-quantization data bits being set to 0 dB, the noise peak value may be situated at −12 dB noise accounts for 0.25. Since the ranging position shifting need be limited to less than 1 bit towards the LSB side per block, as described hereinabove, the magnitude of the noise fed back during the next block is −6 dB of the one bit or 0.5 at most, with the full scale at this time being 0 dB. It is noted that, when the aforementioned limitation is not made, the noise about equal to −12+6×12=60 dB is propagated, since the step of range variation is 13 bits at most. Conversely, when the aforementioned limitation is made, the noise accounts for 0.5 at the maximum in the transient portion. When the multiplication coefficient γ (γ=1) is not set for the signal, data overflow is only equal to the sum of the signal maximum value of 1 and the noise maximum value of 0.5, or 1.5, that is, about +3.5 dB.

After limiting the magnitude of data overflow in this manner, the aforementioned clipping operation is performed.

The clipping operation means an operation in which, upon the occurrence data overflow, the data is fixed or clipped to the positive or negative maximum value of the four bits taken out by re-quantization for preventing the sign inversion from occurring and reducing the error. It is confirmed that adverse effect brought about by clipping, such as signal deformation, can be substantially eliminated by having the error or the difference between the true value and the clipped positive or negative maximum value fed back and carried over to the next block (error feedback), that is, by directly performing the usual error feedback operation.

Conversely, when the error feedback is stopped at the time of clipping, noise shaping becomes temporarily ineffective so that the low range noise of a higher level, that is, the noise related to the decoder filter characteristics is, the noise related to the decoder filter characteristics is produced at the decoder output, the resulting signal deformation being then propagated to cause a serious problem insofar as the auditory feeling is concerned.

Figure 9:
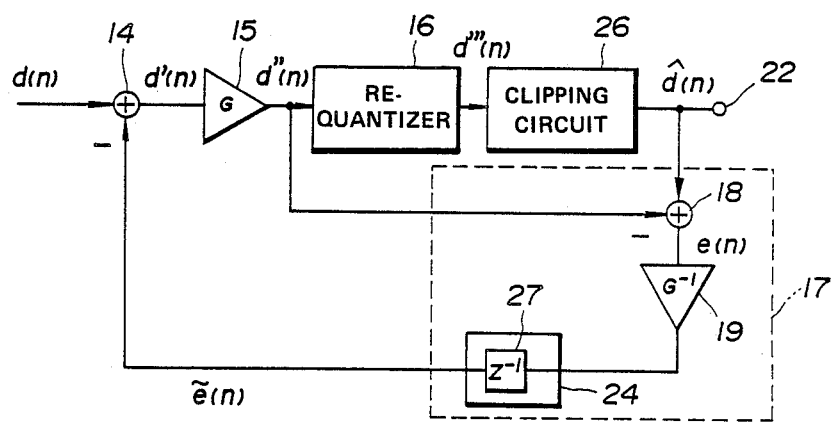
FIG. 9 is a block circuit diagram showing essential parts of the encoder.

For simplifying the description, noise shaping of the first degree as shown in FIG. 9 is hereafter explained.

Referring to FIG. 9, an output d″(n) from shifter 15 is supplied to re-quantizer 16 for re-quantizing from the 16 to 4 bits to produce an output d (n) which is supplied to an overflow clipper 26 and thereby processed to produce an output d̂(n). A quantization error or an error e(n) which is the difference between the input d″(n) to the quantizer 16 and the output d̂(n) from the clipper 26 is supplied via shifter 19 and 1-word delay means 27 in noise shaper 17 to the summation unit 14 as the subtractive signal.

Figure 10:
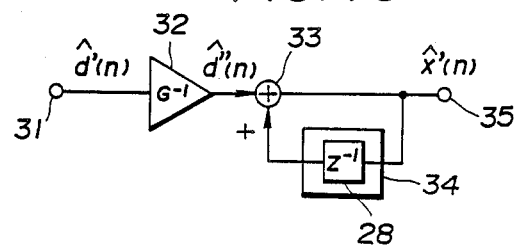
FIG. 10 is a block diagram showing essential parts of the decoder.

While the encoder is formed essentially as shown in FIG. 9, the decoder is formed as shown in FIG. 10, with the estimating unit 34 being a 1-word delay means 28.

It is assumed that, when shifting from a given block (first block) to the next block (second block) with lapse of time, the signal peak value is reduced, and the gain G of the shifter 15 is changed from G to G·g, where g>1. It is also assumed that the last encoder output data of the first block is given as follows:

$$\hat{d}(n) = (d(n) - e(n-1) \cdot G^{-1}) \cdot G + e(n) \quad (21)$$
$$= d(n) \cdot G - e(n-1) + e(n)$$

Then the output d̂″(n) from the shifter 32 of the decoder is given by $$\hat{d}''(n) = d(n) + \{e(n) - e(n-1)\} \cdot G^{-1} \quad (22)$$

The leading encoder output data d̂(n+1) of the second block is $$\hat{d}(n+1) = (d(n+1) - e(n) \cdot G^{-1}) \cdot G \cdot g + e(n+1) \quad (23)$$
$$= d(n+1) \cdot G \cdot g - e(n) \cdot g + e(n+1)$$

while the data d̂″(n+1) in the decoder is assumed that $$d''(n+1) = (d(n+1) + e(n+1) \cdot G^{-1} \cdot g^{-1} - e(n) \cdot G^{-1} \quad (24)$$

When considering the decoder output x̂′(n) and x̂′(n+1), it is assumed that $$\hat{x}'(n-1) = y(n-1) + e(n-1) \cdot G^{-1}$$

Then, from the equation (22), we obtain $$\hat{x}'(n) = y(n-1) + d(n) + e(n) \cdot G^{-1} \quad (25)$$

From these equations (25) and (24), we obtain $$\hat{x}'(n+1) = y(n-1) + d(n) + d(n+1) + e(n+1) \cdot G^{-1} \cdot g^{-1} \quad (26)$$

It is seen from these equations (25) and (26) that, in the absence of data overflow, interference occurs between adjacent blocks such that a large quantization error is the preceding block does not affect the succeeding block.

When data overflow should occur at the leading word of the second block, the term $e(n) \cdot g$ of the equation (23) is responsible for the occurence of data overflow. If an error E has been caused when data overflow has occurred and the clipping is performed as described above, the equation (23) can be rewritten to $$\begin{aligned}\hat{d}(n+1) &= \{d(n+1) - e(n) \cdot G^{-1}\} \cdot G \cdot g + \\ &\quad e(n+1) + E \\ &= \{d(n+1) \cdot G \cdot g - e(n) \cdot g + e(n+1) + E\end{aligned} \quad (27)$$

Thus the equation (24) is rewritten to $$\hat{d}''(n+1) = d(n+1) + \{e(n+1) + E\} \cdot G^{-1} \cdot e(n) \cdot G^{-1} \quad (28)$$

while the decoder output according to the equation (26) is rewritten to $$\hat{x}'(n+1) = y(n-1) + d(n) + d(n+1)\{+e(n+1) + E\} \cdot G^{-1} \cdot g^{-1} \quad (29)$$

The difference between the equations (29) and (26) is $$E \cdot G^{-1} \cdot g^{-1} \quad (30)$$

which difference represents the deformation cause by the clipping in the decoder output.

Referring to error propagation caused by clipping, the encode output corresponding to (n+2) in case of feeding back as usual the error caused in the equation (27) is $$\hat{d}(n+2) = [d(n+2) - \{e(n+1) + E\} \cdot G^{-1} \cdot g^{-1}] \cdot G \cdot g + e(n+2) \quad (31)$$

so that $\hat{d}''(n+2)$ is given as follows:

$$\hat{d}''(n+2) = d(n+2) + e(n+2) \cdot G^{-1} \cdot g^{-1} - \{e(n+1) + E\} \cdot G^{-1} \cdot g^{-1} \quad (32)$$

From these equations (32) and (29), the decoder output is given as follows:

$$\hat{x}'(n+2) = y(n-1) + d(n) + d(n+1) + d(n+2) + e(n+2) \cdot G^{-1} \cdot g^{-1} \quad (33)$$

so that the effect of the error E is removed. Conversely, in case the error produced in the equation (27) is not fed back, we obtain $$\hat{d}(n+2) = d(n+2) \cdot G \cdot g + e(n+2) \quad (34)$$

$$\hat{d}''(n+2) = d(n+2) + e(n+2) \cdot G^{-1} \cdot g^{-1} \quad (35)$$

From these equations (35) and (29), the decoder output is given as follows:

$$\begin{aligned}\hat{x}(n+2) &= y(n-1) + d(n) + d(n+1) + d(n+2) + \\ &\quad e(n+2) \cdot G^{-1} \cdot g^{-1} + \{e(n+1) + E\} \cdot \\ &\quad G^{-1} \cdot g^{-1}\end{aligned} \quad (36)$$

so that the effect caused by the absence of the feedback of $E + e(n+1)$ is propagated.

It is seen from above that the error caused by clipping is also preferably fed back, just as the usual quantization error. In this case, it is only the word that has caused overflow that produces the deformation $E \cdot G^{-1} \cdot g^{-1}$ as shown by the equation (30) without the error being propagated to the succeeding words.

Next, the effect derived from limiting the shifting towards the LSB side of the aforementioned ranging position or the re-quantization bit take-out position is considered.

Figure 11:
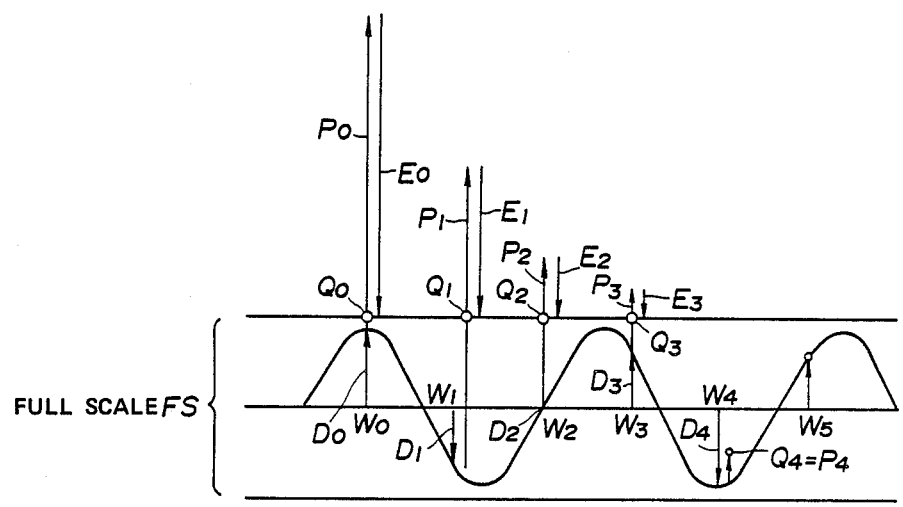
FIGS. 11 and 12 are diagrams for explaining error propagation due to overflow at the time of re-quantization.

Feeding back the clipping error to the next word is indicated in the above equation (31). In this equation (31), the error feed back is the term $\{e+(n+1)+E\} \cdot G^{-1} \cdot g^{-1}$ which may cause a data overflow at the word (n+2). Thus, when the re-quantization bit take-out position or ranging position is suddenly shifted towards the LSB side as shown in FIG. 8B, there incidently occur a situation expressed by $$|d(n+2) \cdot G \cdot g - \{e(n+1) + E\}| >> \frac{F_s}{2} \quad (37)$$

wherein $F_s$ represents the full scale size that can be expressed by the re-quantization bits of the current block. Thus the error E in the word (n+1) is not taken care of in the word (n+2) but data overflow occurs continuously. In this manner, the error caused by data overflow is propagated continuously thus producing considerable signal deformation. This state is shown in FIG. 11. In this figure, the leading word in the block when the above ranging position is suddenly shifted towards the LSB side is $W_0$ and the quantization error caused in the preceding word, that is, the last word in the preceding block, is superimposed on the data $D_0$ of the word $W_0$ to produce the true value $P_0$. Since the true value $P_0$ exceeds the range of the full-scale FS that can be expressed by the re-quantization bits of the current block, thus representing an overflow. Therefore, the aforementioned clipping is performed such that the output value $Q_0$ is fixed to the positive maximum value. The quantization error $E_0$ is the output value $Q_0$ less the true value $P_0$. The error $E_0$ with sign invension, that is, $-E_0$, is superimposed on the data $D_1$ of the next word $D_1$ to give a true value $P_1$. As this value $P_1$ exceeds the full scale FS and represents an overflow, the output value $Q_0$ is clipped to the positive maximum value. Error propagation occurs in this manner. It is noted that, in FIG. 11, the true value $P_0$ of the leading word $W_0$ with error superimposition is set so as to be not higher than several times the full scale, for convenience in illustration, however, the error fed back to $W_0$ may amount to about 1,000 times the full scale or approximately 60 dB such that error propagation may persist for a prolonged time.

Figure 12:
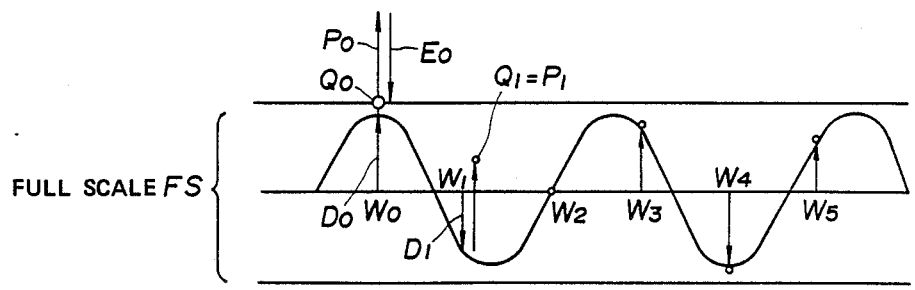

Conversely, when the shifting of the ranging position or the take-out position of the re-quantization bits towards the LSB side is limited to, for example, 1 bit, the error fed back to the leading word $W_0$ of the block is minimized, as shown in FIG. 12, so that error propagation is eliminated within a short time. The result is the reduced level of output signal deformation from the decoder and signal transmission that is not hindersome to the auditory feeling in conjunction with the temporal masking effect.

Third Embodiment

A third embodiment of the present invention is now explained in which the sound quality is improved as compared to the above described second embodiment to provide for high fidelity transmission.

In this third embodiment, the number of the re-quantization bits in the re-quantizer 16 is 8, while two different kinds of the differential processing filters, that is, that outputting the differential PCM data of the first degree and that outputting the straight PCM data, are used. The sampling frequency $f_s$ is selected to be 37.8 kHz, as in the second embodiment, the characteristic curve of the first degree differential filter being as shown by the curve B in FIG. 6. The operating conditions and construction of the present third embodiment are otherwise the same as those of the above described second embodiment.

In the present third embodiment, since the audio data word after re-quantization consists of 8 bits, signal transmission is of higher quality than in the case of the second embodiment. The mean bit rate per word of the transmitted data is 8.214 bits or about 310.5 k bits per second per channel.

In the above described embodiments of the present invention, only the filter wherein the estimated gain $G_p$ for the low range of not higher than fs/6 is not negative in dB indication are used. Thus, so-called summation filters are not used. This is because it is very rare that the high frequency signals exist by themselves in the wide range musical signals and it is always desirable to use differential processing that takes account of the presence of the low to mid range signals.

In the above described first to third embodiments, there is disclosed a signal transmission device in which input digital signals are formed into a block every after a predetermined number of words along time axis, and the blocks are transmitted through filters to obtain an estimated error for a signal for each block. Each of these filters is made up of an estimating unit of the N-th degree and an estimating unit of a degree smaller than the N-th degree. Maximum absolute values in the blocks produced from the filters or the maximum absolute values multiplied by coefficients are compared with one another and a filter is selected that minimizes the value. As a result, filter selection is performed in accordance with the main frequency component of the input signals.

In the digital signal transmission device of the first to third embodiments, plural differential processing filters adapted for outputting high degree differential PCM, first order differential PCM and straight PCM data are used and adaptively selected from one another by switching so that the bit rate is effectively reduced to provide for signal transmission at an extremely low bit rate without deteiorating signal quality. Since the output modes of the straight PCM data can be selected by switching in the similar manner, it is possible to eliminate the problems of deterioration in the S/N ratio at the time of inputting of high frequency range signals while also preventing generation of high error power from occuring on occurrence of error signals.

In addition, the peak or maximum absolute value in the block at the output of the selected filter is multiplied by a coefficient $\gamma$ (where $\gamma \geq 1$) and the ranging position or the take-out positions of the re-quantization bits are determined on the basis of the thus multiplied values, so that data overflow is less likely to occur even when there is superimposed a feedback error resulting from the noise shaping operation.

Also, when the input signal level is rapidly lowered in the vicinity of the block boundaries, the ranging position or the take-out positions of the re-quantization bits being rapidly shifted towards the LSB side, limitations can be placed on the shift for reducing the error caused by overflow of the re-quantization bits. At this time of overflow of the re-quantization bits, the signal level can be clipped at the maximum position or negative value and the error is then fed back and subjected to noise shaping for suppressing noise propagation and effectively preventing adverse effect such as generation of unusual sounds.

However, when the estimating filters are used as in the above described embodiments for reducing the transmission bit rate, and when it is desired to improve the S/N ratio to close to its ideal value, it is necessary to use a sufficiently long operating word length of the digital filter.

For example, when an encode filter or FIR filter including an estimating unit of a second degree and having an estimated gain of 36 dB is used at the encoder side, an allowance of at least 6 bits need be provided to the lower place side of the LSB in order to provide the operating word length of the decoder side IIR digital filter. Even if the allowance of 6 bits is provided, it is not possible to equate the noise level existing in the absence of input signals to the noise level of the usual PCM signals not subjected to bit compression processing. Hence it is necessary to use a still longer operating word length in order to equate the noise levels. The result is the prolonged word length of the multiplication or summation units or memories of the IIR digital filters and increased circuit scale.

A further embodiment of the present invention will be hereafter explained in which, for eliminating these inconveniences, an S/N ratio close to the ideal value or equivalent thereto can be realized with a simple structure and with the operating word length comparable to or shorter than that used in the conventional system.

Fourth Embodiment

Figure 13:
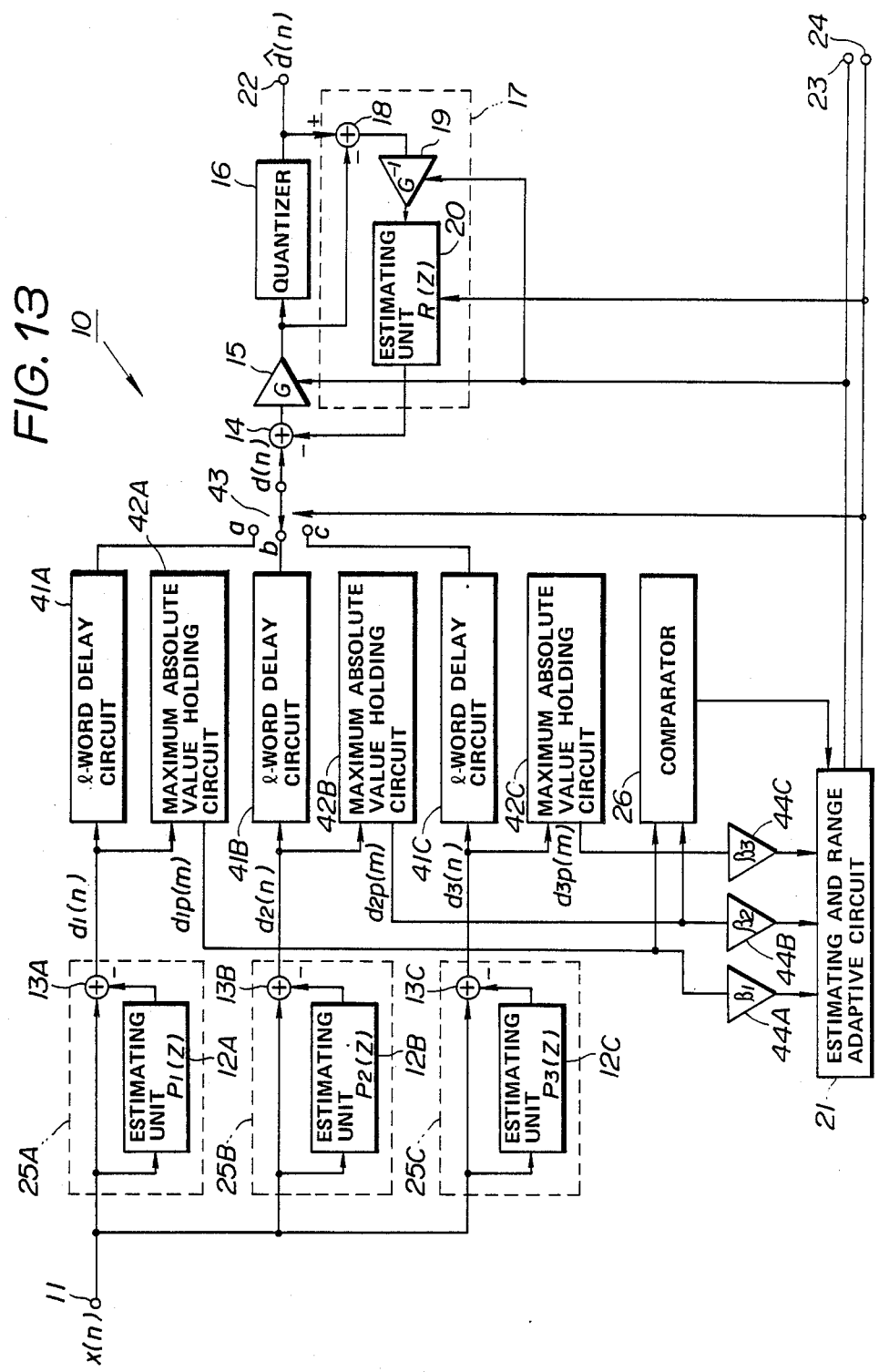
FIG. 13 is a block circuit diagram showing a practical example of the encoder used in the fourth embodiment of the present invention.

FIG. 13 shows a practical example of the encoder of the aforementioned bit rate reduction system as essential part of the digital signal transmission device according to a fourth embodiment of the present invention. In this figure, the parts similar to those shown in FIGS. 1 and 2 are indicated by the same reference numerals.

Figure 14:
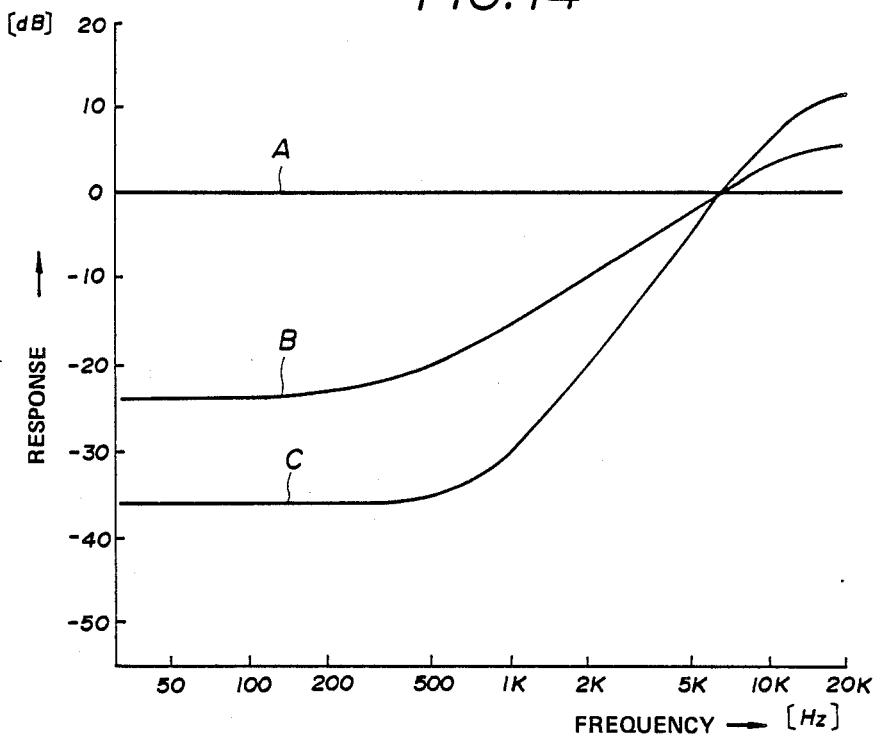
FIG. 14 is a chart showing typical frequency characteristics of the encode filters used in FIG. 13.

Referring to FIG. 13, a plurality of, for example, three filters 25A, 25B and 25C are previously provided as the encode filter or differential processing filter 25 and one of these filter 25A to 25C having occasionally the optimum properties is selected in accordance with input signals. These encode filters 25A to 25C are respectively provided with estimating units 12A to 12C, with the outputs of the estimating units 12A to 12C being transmitted to summation units 13A to 13C for subtraction from the original input signals. Thus, with system function of the estimating units 12A, 12B and 12C being $P_1(z)$, $P_2(z)$ and $P_3(z)$, transfer functions of the filters 25A, 25B and 25C are $1 - P_1(z)$, $1 - P_2(z)$, and $1 - P_3(z)$, respectively. Typical characteristic of these filters 25A, 25B and 25C are shown by characteristic curves A, B and C in FIG. 14, respectively. In this figure, the characteristic curves A, B and C represent, for example, the following:

A: $1 - P_1(z) = 1$

B: $1 - P_2(z) = 1 - 0.9375 z^{-1}$

C: $1 - P_3(z) = 1 - 1.796875 z^{-1} + 0.8125 z^{-2}$ with the sampling frequency $f_s$ being 37.8 kHz. Thus the conventional straight PCM data are outputted from the filter 25A corresponding to the characteristic curve A, the differential PCM data of the first degree are outputted from the filter 25B corresponding to the characteristic curve B, and the differential PCM data of the second degree are outputted from the filter 25B corresponding to the characteristic curve C.

The output signals from these encode filters are transmitted to l-word (or one-block) delay circuits 41A, 41B, and 41C and to maximum absolute value (or peak value) hold circuits 42A, 42B and 42C, respectively, while the output signals from the l-word delay circuit 42A, 42B and 41C are transmitted to select terminals a, b and c of a mode changeover (or filter selecting) switching circuit 42. Thus, as the output signals are delayed by one block in the l-word delay circuits 41A, 41B and 41C, maximum absolute values or peak values $d_1p(m)$, $d_2P(m)$, and $d_3P(m)$ of the output data $d_1(n)$, $d_2(n)$ and $d_3(n)$ from the filters 25A, 25B and 25C in each block are determined in the respective hold circuits 42A, 42B and 42C. The letter m indicates the block number. In general, when the maximum integer not exceeding a figure x is indicated as [x], each word consisting of l blocks, the block number m is indicated as m [n/l].

There peak values $d_1p(m)$, $d_2P(m)$ and $d_3P(m)$ in the block are multiplied at coefficient multiplication units 44A, 44b and 44C by weight factors or coefficients $\beta_1$, $\beta_2$, $\beta_3$, respectively before being transmitted to the estimating and range adaptive circuit 21. In the circuit 21, the weighted peak values $\beta_1 \cdot d_1p(m)$, $\beta_2 \cdot d_2p(m)$ and $\beta_3 \cdot d_3p(m)$ from the coefficient multiplication units 44A, 44B and 44B and 44C are compared to one another and the smallest of these values is detected. The adaptive circuit 21 transmits as output signal a mode selecting information that will select the filter that will output this smallest value. This mode selection information is transmitted to a changeover switch 43, the estimating unit 20 and to the output terminal 24.

Figure 15:
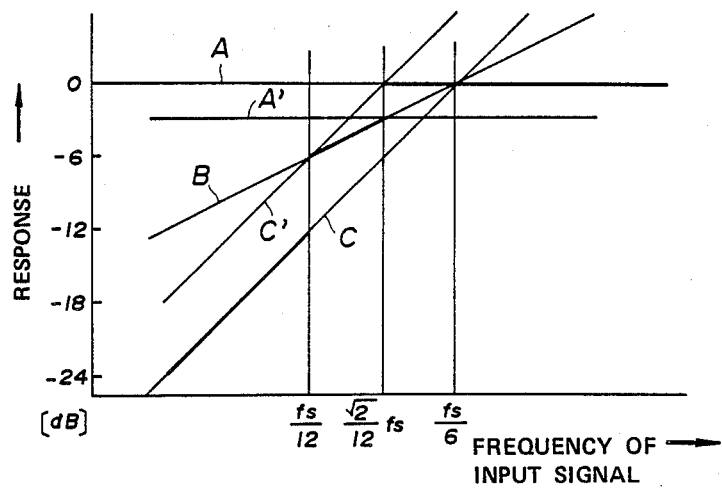
FIG. 15 is a chart for explaining typical filter selecting operation performed in accordance with the input signal frequency.

FIG. 15 shows the manner in which the encode filters 25A, 25B and 25C are selected when the weight factors or coefficients $\beta_1$, $\beta_2$ and $\beta_3$ of the coefficient mulitiplication units 44A, 44B and 44C are set so as to be equal to about 0.7, 1 and 2.0 respectively. In this figure, the frequency response of the characteristic curve A corresponding to the filter 25A outputting straight PCM data is shifted down or to the low level side by about 3 dB to a curve A' as it is weighted by the coefficient $\beta_1 \approx 0.7$ at the multiplication unit 44A. As for the characteristic curve C corresponding to the filter 25C outputting the differential PCM data of the second degree, it is weighted at the multiplication unit 44C by the coefficient $\beta_3 = 2.0$ and thereby shifted up or to the high level side by about 6 dB to a curve C'. As for the characteristic curve B corresponding to the filter 25B outputting the differential PCM data of the first degree, it is not weighted by the multiplication unit 44B ($\beta_2$ being equal to unity) so that the original curve B is used without modifications. The frequencies at the points of intersection between the curves A' and B and the curves B and C are $(\sqrt{2}/12) f_s$ and $(f_s/12)$, resepctively, where $f_s$ represents the sampling frequency. With $f_s$ equal to 37.8 kHz, $(\sqrt{2}/12) f_s$ is approximately equal to 4.45 kHz and $(f_s/12)$, is equal to 3.15 kHz. Since the adaptive circuit 21 selects that one of the characteristic curves A', B and C' that has the lowest level, the second-degree differential PCM mode selection information corresponding to the curve C is outputted for the input signal frequency from the low level to $(f_s/12)$, the first-degree differential PCM mode selection information corresponding to the curve B is outputted for the input signal frequency from $(f_s/12)$ to $(\sqrt{2}/12) f_s$ and the straight PCM mode selection information is outputted for the input signal frequency not lower than $(\sqrt{2}/12) f_s$. When the mode selection information from the estimating and range adaptive circuit 21 is the straight PCM mode, changeover switch 43 is switched to terminal a such that the striaght PCM data obtained from filter 25A through the l-word delay circuit 41A is transmitted from changeover switch 43 to the summation unit 14 of the next stage. Similarly, when the mode selection information is the first-degree differential PCM mode, changeover switch 43 is switched to terminal b so that the first-degree differential PCM data obtained from the filter 25B through delay circuit 41B is transmitted to the summation unit 14. When the mode selection information is the second-degree differential PCM mode, changeover switch 43 is switched to terminal C so that the second-degree differential PCM data obtained from filter 25C through the delay circuit 41C is transmitted to the summation unit 14. Hence, the frequency response of the output d(n) transmitted from changeover switch 43 to the summation unit 14 is as indicated by the thick solid line in FIG. 15.

In addition, in accordance with the present invention, when the peak value in the block of the output signal from the low degree encode filter is lesser than a predetermined constant value $L_0$, this low degree filter is selected as the optimum filter, this selection thus being made in preference to the above described selecting operation of the optimum filter or to the mode switching operation mainly based on the frequency of the input signals.

The predetermined constant value $L_0$ is determined in general in accordance with the number of re-quantization bits N or the word length of the data supplied and transmitted from the output terminal 22 after re-quantization at the quantizer 16 and may for example be equal to $2^{N-1} - 1 (L_0 = 2^{N-1} - 1)$. For example, when the number of re-quantization bits is 4(N−4), data transmission becomes possible without data omission at the time of re-quantization. Thus, when the peak value or the maximum absolute value $d_1P(m)$ in the block of the straight PCM data from the filter 25A is smaller than 7 which is $L_0$ defined above, the filter 25A for outputting the straight PCM data is preferentially selected without regard to the input signal frequency so that the higher degree differential processing filters 25B, 25C with the larger estimated gains are not selected. In addition, even when the peak value $d_1P(m)$ in the block is larger than $L_0$, if the peak value $d_2P(m)$ in the block of the first degree differential PCM data from the filter 25B is not larger than 7 which is $L_0$ as defined above, the first degree differential processing filter 25B is preferentially selected and thus the higher or second degree differential processing filter 25C with the larger estimated gain is not selected. The peak values $d_1P(m)$ and $d_2P(m)$ in each block of the data from the filters 25A and 25B of the lower degree (with the lesser estimated gains) are transmitted to a comparator 26 from which the results of comparison with the constant value $L_0$ are transmitted to the estimating and range adaptive circuit 21 where the preferential optimum filter is selected as described above. Thus the mode selection information from the estimating and range adaptive circuit 21 is the information based on which the mode selection is performed in accordance with the above described filter output level and in preference to the above described mode selection that is performed in accordance with the input signal frequency. Practical Example of Filter Selecting Operation in the Fourth Embodiment.

Figure 16:
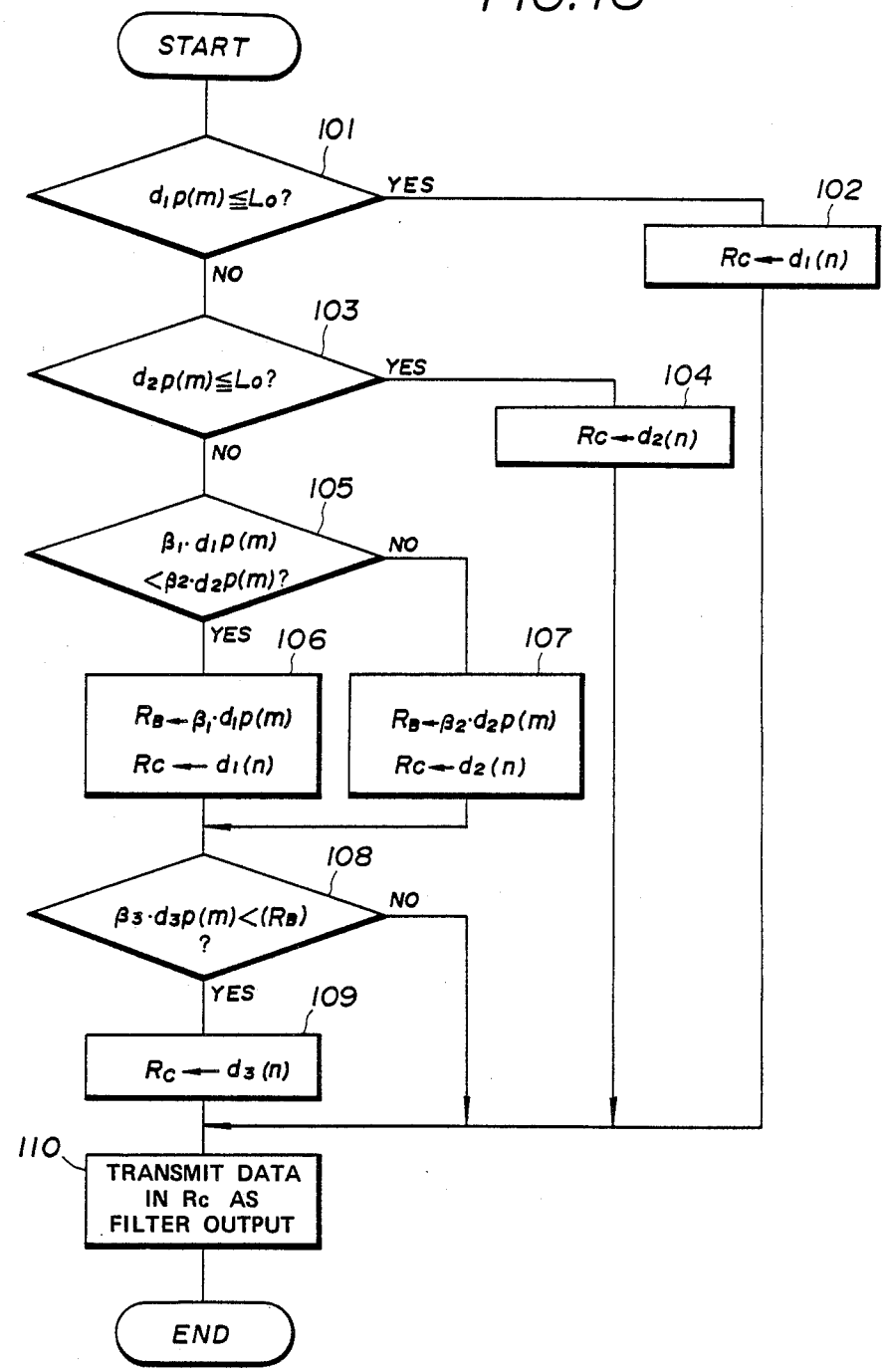
FIGS. 16 and 17 are flow charts showing examples of the different procedures for selecting an optimum filter in accordance with the fourth embodiment of the present invention.
Figure 17:
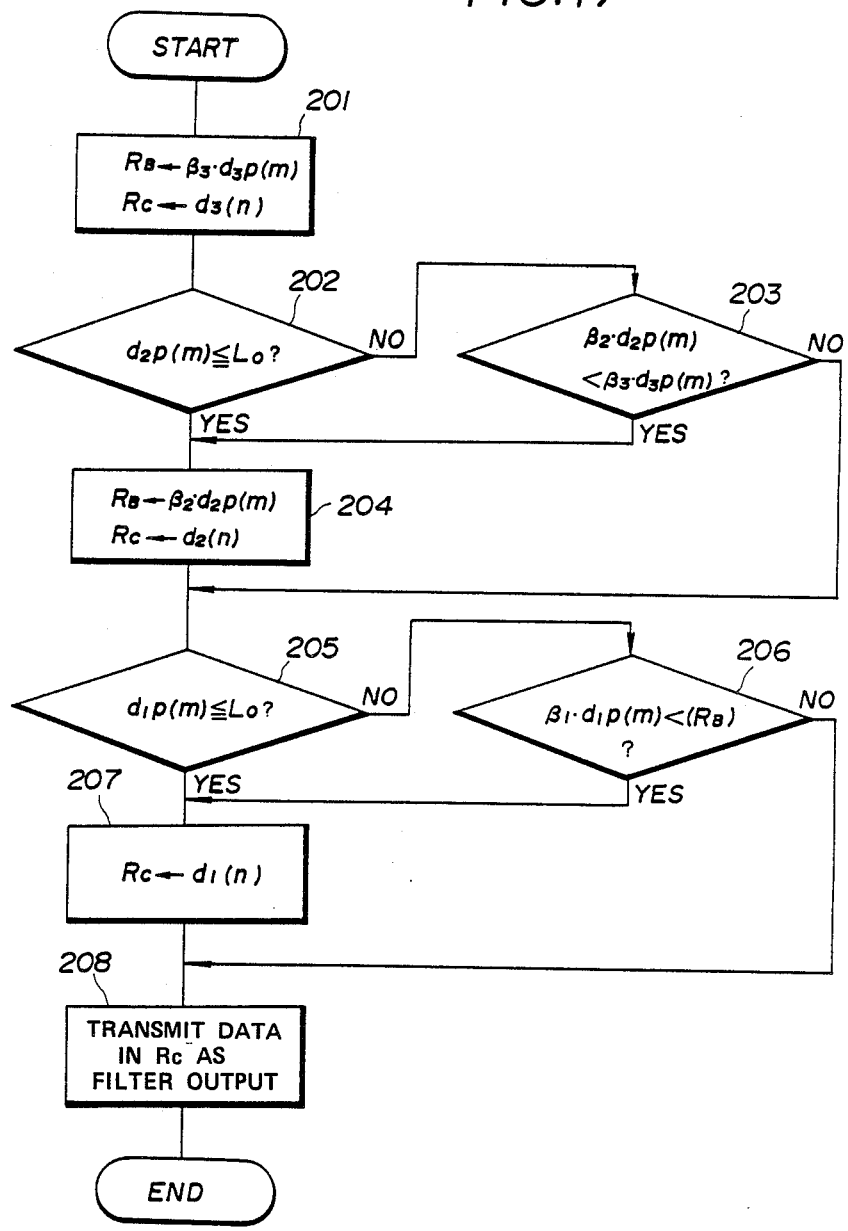

A practical example of the selection of the preferential optimum filter in the encoder 10 of FIG. 13 as described above is explained by referring to the flow charts shown in FIGS. 16 and 17.

Referring first to FIG. 16, it is judged in step 101 whether the peak value $d_1P(m)$ in the block of the above described straight PCM data is less than the aforementioned constant value $L_0$ (which for example is 7). If the answer is YES, control proceeds to step 102 where the straight PCM data $d_1(n)$ in the block or the pointer address is stored in a register $R_c$. If the answer is NO, control proceeds to step 103. In step 103, it is judged whether the peak value $d_2P(m)$ in the block of the aforementioned first degree differential PCM data is less than the constant value $L_0$. If the answer is YES, control proceeds to step 104 where the first degree differential PCM data $d_2(n)$ or its pointer address is stored in the register $R_c$. If the answer is NO, control proceeds to step 105.

The above described operational sequence corresponds to selection of the preferred filter in the comparator 26 shown in FIG. 13, while the operational sequence from step 105 et seq corresponds to selection of the optimum filter similar to that described with reference to the first to third embodiments.

Thus, in step 105, the peak value in the block of the straight PCM data $d_1P(m)$ multiplied by the weighting factor or coefficient $\beta_1$ of, for example, 0.7, or $\beta_1 \cdot d_1P(m)$, and the value in the block of the first degree differential PCM data $d_2P(m)$ multiplied by the weighting factor or coefficient $\beta_2$ of, for example, 1.0, or $\beta_2 \cdot d_2P(m)$, are compared to each other to discern whether $\beta_1 \cdot d_1P(m)$ is smaller than $\beta_2 \cdot d_2P(m)$. If the answer is YES, control proceeds to step 106, and if the answer is NO, control proceeds to step 107. If step 106, the value $\beta_1 \cdot d_1P(m)$ is stored in register $R_B$, while the straight PCM data $d_1(n)$ or its pointer address is stored in register $R_C$, before control proceeds to step 108. In step 107, the value $\beta_2 \cdot d_2P(m)$ is stored in register $R_B$, while the first degree differential PCM data $d_2(n)$ or its pointer address is stored in register $R_C$, before control proceeds to step 108. In step 108, it is discerned whether the peak value in the block of the second-degree differential PCM data $d_3P(m)$ multiplied by a weighting factor or coefficient $\beta_3$ of, for example, 2.0, or $\beta_3 \cdot d_3P(m)$ is smaller than the data in register $R_B$, indicated as data $R_B$. If the answer is YES, control proceeds to step 109 and, if the answer is NO, control proceeds to step 107. If step 106, the value $\beta_1 \cdot d_1P(m)$ is stored in register $R_B$, while the straight PCM data $d_1(n)$ or its pointer address is stored in register $R_C$, before control proceeds to step 108. In step 107, the value $\beta_2 \cdot d_2P(m)$ is stored in register $R_B$, while the first degree differential PCM data $d_2(n)$ or its pointer address is stored in register $R_C$, before control proceeds to step 108. In step 108, it is discerned whether the peak value in the block of the second-degree differential PCM data $d_3P(m)$ multiplied by a weighting factor or coefficient $\beta_3$ of, for example, 2.0, or $\beta_3 \cdot d_3P(m)$ is smaller than the data in register $R_B$, indicated as data $R_B$. If the answer is YES, control proceeds to step 109 and, if the answer is NO, control proceeds to step 110. Then, in step 109, the second-degree differential PCM data $d_3(n)$ or its pointer address is stored in register $R_C$. Then, in step 110, the address data specified by the data in register $R_B$ or data in address $R_C$ is transmitted as optimum filter output data to the ranging and noise shaping circuits for the next stage. It is noted that control proceeds also to step 110 after execution of the steps 102 and 104.

The operational sequence indicated by the steps of the flow chart of FIG. 16 can be changed as desired. For example, the operation practically equivalent to that shown in FIG. 17 can be realized by the procedure shown in FIG. 17.

In FIG. 17, discrimination of the peak values in the block is performed in regular order from the differential processing filter of the higher degree. Thus, in step 201, the weighted peak value in the block from the second-degree differential filter $\beta_3 \cdot d_3P(m)$ is stored in register $R_B$, while the data $d_3(n)$ in the block or its pointer address is stored in register $R_C$, before control proceeds to step 202. In step 202, it is discerned whether the peak value in the block of the first-degree differential PCM data is lesser than the constant value $L_0$. If the answer in NO, control proceeds to step 203. If the answer is YES, control proceeds to step 204. In step 203, it is discerned whether the weighted peak value in the block $\beta_2 \cdot d_2P(m)$ is lesser than $\beta_3 \cdot d_3P(m)$. If the answer is YES, control proceeds to step 204. If the answer is NO, control proceeds to step 205. In step 204, the weighted peak values $\beta_2 \cdot d_2P(m)$ is stored in register $R_B$, while the data $d_2(n)$ or its address is stored in register $R_C$, before control proceeds to step 205. In step 205, it is discerned whether the peak value in the block of the straight PCM data $d_1P(m)$ is lesser than the constant value $L_0$. If the answer is NO, control proceeds to step 206. If the answer is YES, control proceeds to step 207. In step 206, it is discerned whether the value $\beta_1 \cdot d_1P(m)$ is lesser than the data $(R_B)$ in register $R_B$. If the answer is YES, control proceeds to step 207. If the answer is NO, control proceeds to step 208. In step 207, the data $d_1(n)$ or its address is stored in register $R_C$ before control proceeds to step 108. In step 208, which is similar to step 110 in FIG. 16, the data in register $R_C$ or the data of the address specified thereby is transmitted as the optimum filter output data to the circuit part of the next stage.

By executing the filter selecting operational sequence in accordance with the above described flow chart procedure shown in FIGS. 16 or 17, the filter of the lower degress is preferentially selected in case of inputting of a smaller signal wherein the peak value in the block of the straight PCM data $d_1P(m)$ or the peak value in the block of the first degree differential PCM data $d_2P(m)$ is not larger than the predetermined constant value $L_0$ which, in the case of 4-bit transmission, may be equal to 7. Thus the first degree differential processing filter is selected in preference to the second degree differential processing filter and the straight PCM data output filter is selected in preference to the first degree differential filter. In general, the constant value $L_0$ may be so set that $L_0=2^{N-1}$ wherein N represents the re-quantizing bits.

Noise due to Finite Operating Word Length in the Fourth Embodiment

As described above, the lower degree filters, i.e. the filters with smaller estimated gains may be preferentially selected in case of the filter output level being low for reducing the noise level without the necessity of using a longer operating word length in the filter.

This is because the filter with a smaller estimated gain behaves more advantageously in connection with the noise produced by limitation of the operating word length.

It is noted that, in the digital filters such as the aforementioned estimating units 12, 20 and 34, arithmetic operations including coefficient multiplicaton or data summation are performed on the input data or delayed output data thereof. With the operating word length used in the arithmetic operations being finite, so-called operational errors are produced due to fraction omission or half adjustment.

Figure 18:
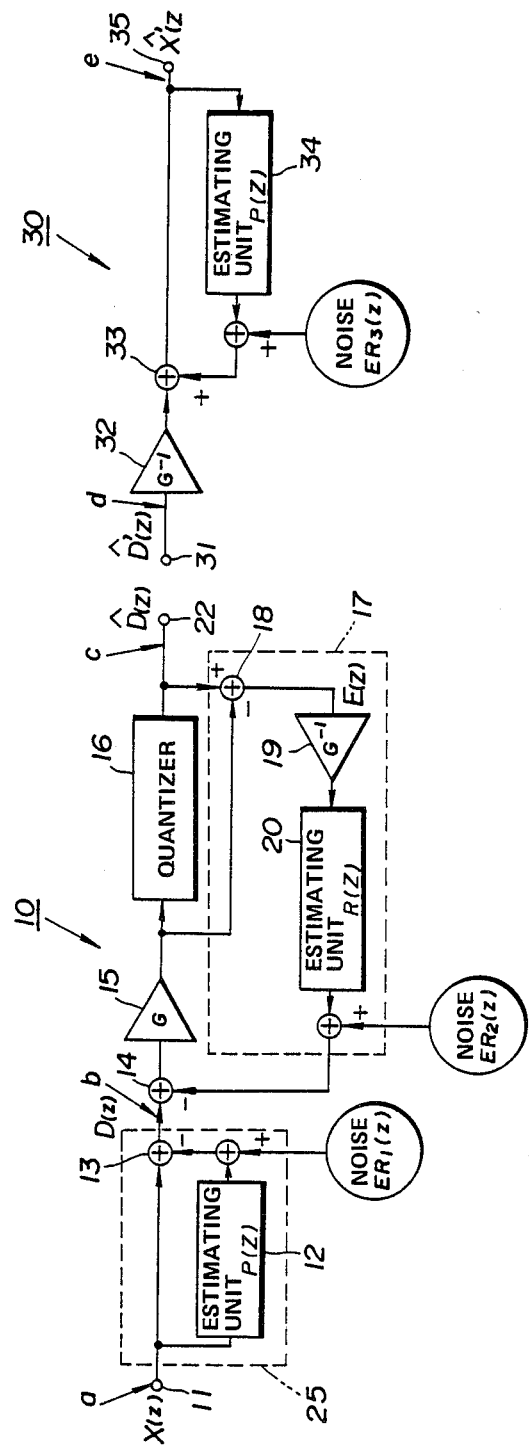
FIG. 18 is a block circuit diagram of the overall system with the noise due to the finite operating word length taken into account.

It is assumed that these operational errors for the filters are indicated by $er_1(n)$, $er_2(n)$, while the z-transformation thereof are indicated by $ER_1(z)$, $ER_2(z)$ and $ER_3(z)$, respectively, as indicated in FIG. 18. That is, at the side of encoder 10, it is assumed that the operational error at the filter 25 including the estimating unit 12 whose transfer or system function is P(z) is indicated by $Er_1(z)$ is indicated by $ER_2(z)$. At the side of decoder 30, it is assumed that the operational error at the filter including the estimating unit 34 whose system function is P(z) is indicated by $ER_3(z)$. These noises added at the filters are scattered as white noise without relevance to the input signals. Considering these noises, encode and decode characteristics are represented by $$X(z)(1 - P(z)) - ER_1(z) = D(z) \qquad (38)$$

$$(D(z) - E(z) \cdot G^{-1} \cdot R(z) - ER_2(z))G + E(z) = \hat{D}(z) \qquad (39)$$

Substituting the equation (39) into equation (38) and simplifying, the encode output is given by $$\hat{D}(z) = G \cdot X(z)(1-P(z)) - G(ER_1(z)+ER_2(z)) + E(z)(1-R(z)) \qquad (40)$$

Similarly, the decode characteristics are given by $$\hat{X}'(z) = \hat{D}'(z) \cdot G^{-1} + P(z) \cdot \hat{X}'(z) + ER_3(z) \qquad (41)$$

$$\hat{X}(z) = \hat{D}(z) \cdot G^{-1} + P(z) \cdot X(z) + ER_3(z) \qquad (41)$$

$$\hat{X}(z) = \frac{G^{-1} \cdot \hat{D}(z) + ER_3(z)}{1 - P(z)} \qquad (42)$$

Assuming that no error is caused in the transmission channel hence D'(d)=D(z) and substituting the equation (40) into equation (42), $$\hat{X}(z) = X(z) \cdot G^{-1} \cdot E(z) \frac{1-R(z)}{1-R(z)} + \frac{-ER_1(z) - ER_2(z) + ER_3(z)}{1-P(z)} \qquad (43)$$

Thus the noise produced at the respective respective filter are summed to the output signal and the resulting signal is filter processed with (1/1−P(z)) so as to produce an ultimate ouput signal. This means that the filter with a lower filter gain of (1/1−P(z)) corresponding to the estimated gain of the encode filter 25 behaves more favorably insofar as the noise caused by the operating word length is concerned.

It is noted that, when the audio bit rate reduction system according to the present embodiment is applied to the optical data file disk system or so-called CDROM system, it is only up to the user to purchase the optical disk reproducing device or so-called CDROM player, it being unnecessary to perform data recording such that, despite the more or less complicated structure of the encoder 10, it would be sufficiently practical if the decoder 30 can be simplified in structure.

With this in view, it is assumed that a sufficiently long operating word length may be used at the encoder 10 and that both encoder side noises $ER_1(z)$ and $ER_2(z)$ due to the operating word length are zero. In the following, the operating word length required at the decoder side, that is, the allowable maximum noise $ER_3(z)$ is considered.

Figure 19:
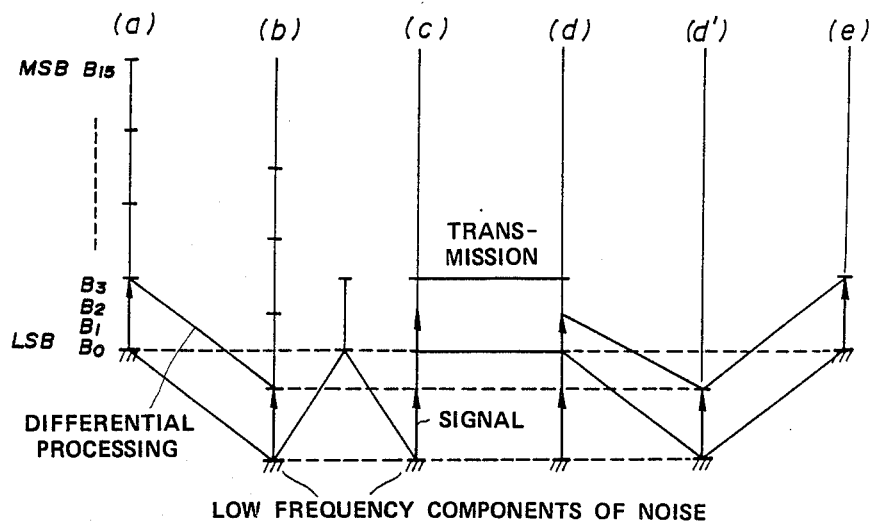
FIGS. 19 and 20 are charts showing signal levels at points a to e in FIG. 18 for input signals of different signal levels.
Figure 20:
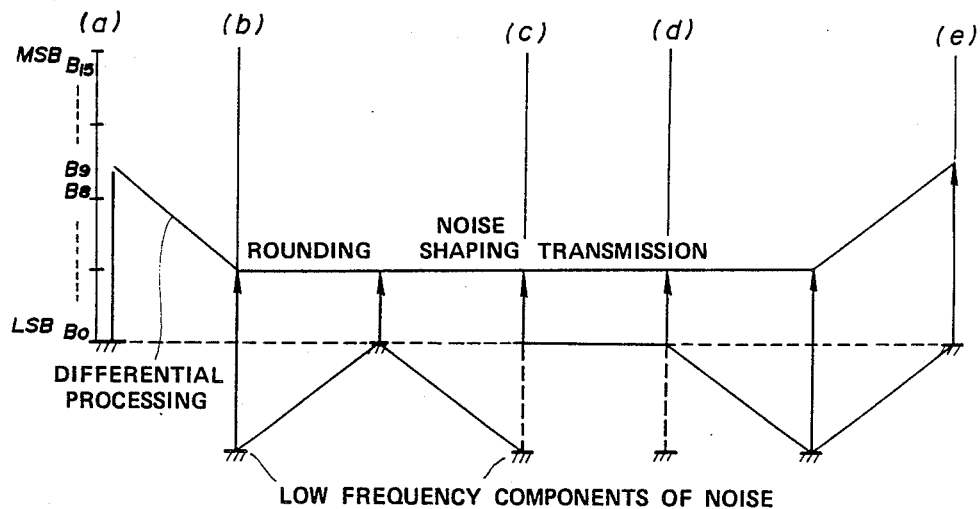

In FIGS. 19 and 20, the signal levels at the points a to e in FIG. 18 are schematically shown for the instance the second-degree differential mode is selected. FIG. 19 shows the case the input signal level is low and the data can be expressed within the range of 4 bits from the LSB (least significant bit). FIG. 20 shows the case the input signal level is higher and the data can be expressed within the range of 10 bits from the LSB.

In the differential processing filter 25, the estimated gain for the second-degree differential mode is as large as about 36 dB at the lower range side of from e.c. to about 1 kHz, this being equivalent to shifting of 5 to 6 bits and corresponding to the level shifting from point a to point b in FIGS. 19 and 20. Then, ranging and noise shaping are performed at the shifter 15, quantizer 16 and the noise shaping circuit 17. In the present system, with the 4-bit word length of the data transmitted after ranging, the position of taking out the bits for ranging is within the range from $B_0$ to $B_3$ which is 4 bits higher than $B_0$ indicative of LSB or least significant bit, insofar as the ranging of the smallest input signal is concerned. Thus, as shown in FIG. 19, the data of the point b shifted towards the lower place side than LSB or bit $B_0$ by the differential processing is transmitted by said noise shaping as the variation of the bits $B_0$ and $B_1$, as indicated by the thick arrow mark at point c in FIG. 19. The reason is that, by nosie shaping, transmission of data in the range from the LSB or bit $B_0$ to 6 bits below the LSB becomes possible with the four bits $B_0$ to $B_3$, insofar as the low frequency range signal is concerned. The low frequency range noise component then exists 6 bits to the lower place side than LSB or about 36 dB lower than it. At the decoder 30, the data of the four bits $B_0$ to $B_3$ are supplied to the point d. From these 4-bit data, the lower 6 bits are produced by decoding for reconstruction of the data entered at the point a. FIG. 20 shows for reference the operation at the usual input signal level.

It is seen from above that, in case of using a filter of the second-degree differential mode with the estimated gain of about 36 dB, an allowance of about 6 bits towards the lower place side of LSB is required as the decoder side operating word length especially when the input signal is of the extremely low level.

According to the measured data, allowance of 6 bits towards the lower place side of the LSB is not sufficient when no input signal exists. This is possibly due to the influence of the so-called limit cycle in which, when the decode side filter or IIR filter is of a higher degree, signals of an extremely low level are outputted even when no input signals are supplied.

Thus, according to the fourth embodiment of the present invention, the lower degree filter, or the filter with a smaller estimated gain is preferentially selected when the input signal is at an extremely low level, such that a sufficient S/N ratio may be realized without the necessity of increasing the allowance bit length to the lower place side of the LSB of the operating word length.

That is, when the input signal is an extremely low level signal that can be expressed by a number of bits less than the re-quantization bit number N, signal compression by differential processing of a degree higher than the first degree is not effective to improve the S/N ratio, but only results in increased adverse effect caused by operating word length limitation at the time of recording. Since the peak value $d_1P(m)$ in the block of the straight PCM data is then not larger than the constant value $L_0(=2^{N-1}-1)$, the encode filter of the straight PCM mode (filter 25A of FIG. 13) is selected, so that the input original sampling crest-value PCM data is directly re-quantized, with the number of bits effective as signal being not larger than the number of re-quantization bits N, that is, the lower place side N bits resulting from the re-quantized are transmitted. In this manner, the original input signals can be reconstructed without any adverse effect by the noise caused during decoding by the operating word length limitation, thus resulting in the decode output with a more favorable S/N ratio.

Also, when the effective signal component of the straight PCM data exceeds N bits, but the first-degree differential output is expressed by a bit number not larger than N, with the peak value $d_2P(m)$ in the block being not larger than the constant value $L_0(=2^{N-1}-1)$, it is only sufficient to transmit the first-degree PCM data, since the selection of the second-degree differential PCM mode which is of the higher degree and larger in estimated gain does not result in the improved S/N ratio. The decode output at this time is subject to lesser noise due to operating word length limitation than in the case the second degree differential mode is selected.

Moreover, since the lower degree filter with a smaller estimated gain is more likely to be selected in general, it becomes possible to suppress to some extent any adverse effects due to increased estimated gain on occurence of the code error, thus resulting in improved invulnerability to the code error.

Examples of Measured Results in the Fourth Embodiment

Measured results on the decode output obtained by the above described construction and operation are hereafter explained.

Figure 21:
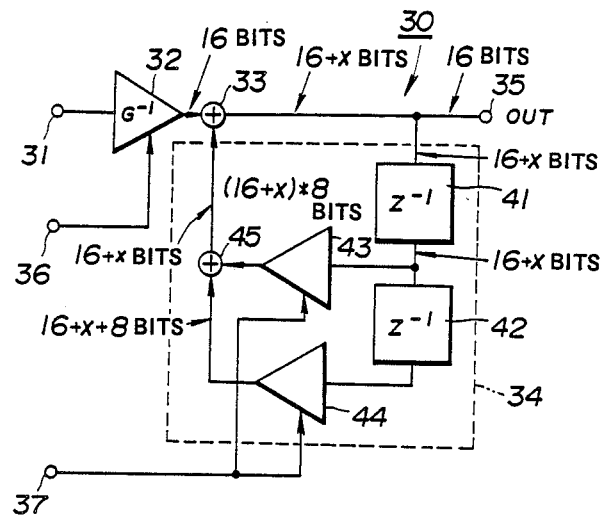
FIG. 21 is a block circuit diagram showing practical examples of the decoder shown in FIG. 1.

FIG. 21 is a block circuit diagram showing a practical example of the decoder 30 shown in FIG. 1. The estimating unit 34 is in the form of an FIR (finite impulse response) digital filter of the apparently second order consisting of two unit delay elements 41, 42, two coefficient multiplication units 43, 44 and a summation unit 45. It is noted that the estimating unit 34 formed by the FIR filter is inserted and connected in the feedback channel connecting from the output side of the summation unit 33 to the unit 33 itself for constituting an IIR (infinite inpulse response) digital filter of the apparently second degree as a whole.

When the digital signal with a word length of for example, 16 bits, are supplied from the shifter 32 to the IIR filter consisting of the summation unit 33 and the estimating unit 34, x bits are added as allowance bits to the lower place side of the LSB (least significant bit) of the 16-bit word length for performing an arithmetic operation in the filter. FIG. 21 shows the operating word lengths at the various circuit portions.

Figure 22:
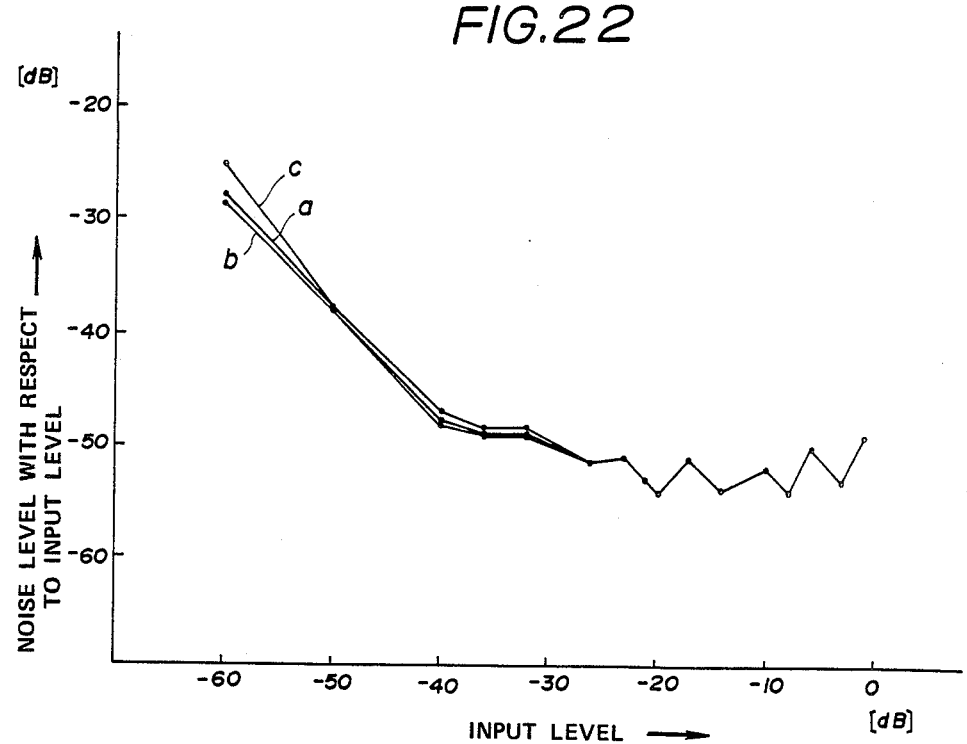
FIG. 22 is a chart showing the noise level of the decoder output with respect to the input signal level.
Figure 23A:
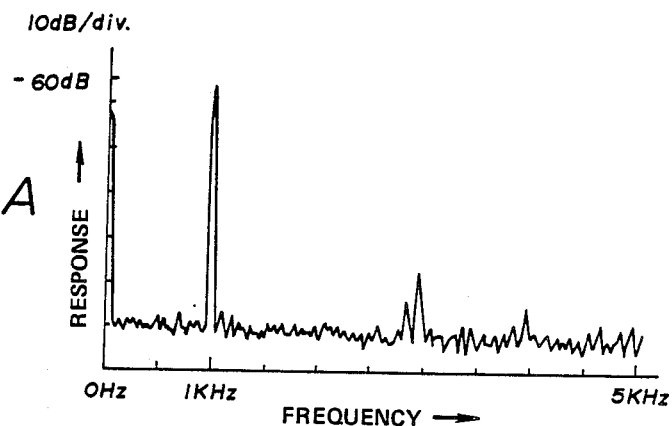
FIGS. 23A-23C and 24A-24C are charts showing the frequency spectra of the decode output.

FIGS. 22 and 23 show the measured results of the S/N ratio of the decoder output for the case in which the aforementioned preferential filter selection processing is not performed (hereafter referred to as comparative example or the example of non-processing) and the case in which preferential filter selection processing as a function of the filter output level is performed in accordance with the present invention, wherein the decoder 30 designed and constructed as shown in FIG. 21 is used and a sufficient number of lower place side allowance bits, such as 6 or more bits are used for performing an arithmetic operation at the encoder side filter.

FIG. 22 shows the noise level of the decoder output with respect to the input signal level. In the drawing, the fold line a represents the case in which preferential filter selection processing is carried out in accordance with the present invention with the use of 4 lower place side allowance bits x for the decoder 30 of FIG. 21. Fold lines b and c in FIG. 22 represent the case of the comparative example or example of non-processing, wherein 6 and 4 lower place side allowance bits at the decoder are used, respectively.

It is seen from FIG. 22 that, as the input level is lowered, a difference between the noise level for the case of the comparative example (example of non-processing) with the 6 lower place side allowance bits (fold line b) and that for the case of the same example with the 4 lower place side allowance bits (fold line c) is increased. In the example shown by fold line a in which the processing of the present invention is performed, despite the small number of the low place side allowance bits of 4 bits, the noise level is of the same order of amagnitude $a_0$ in the case of the comparative example of 6 bits (fold line c). This indicates that the S/N ratio is not deteriorated.

Figure 23B:
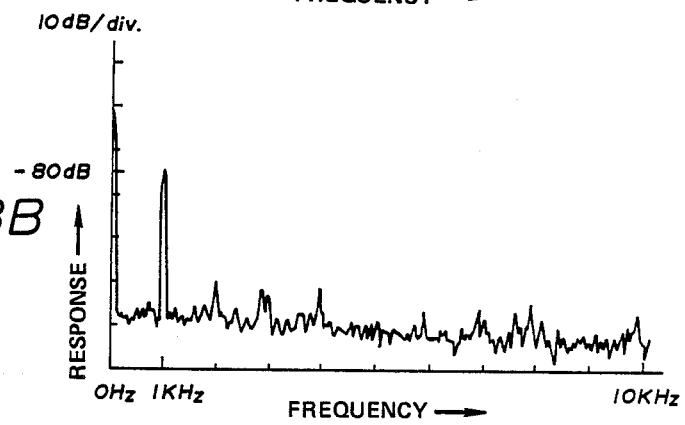
Figure 23C:
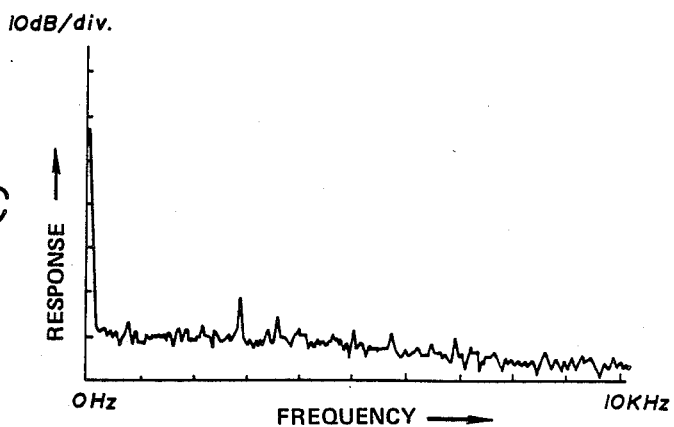
Figure 24A:
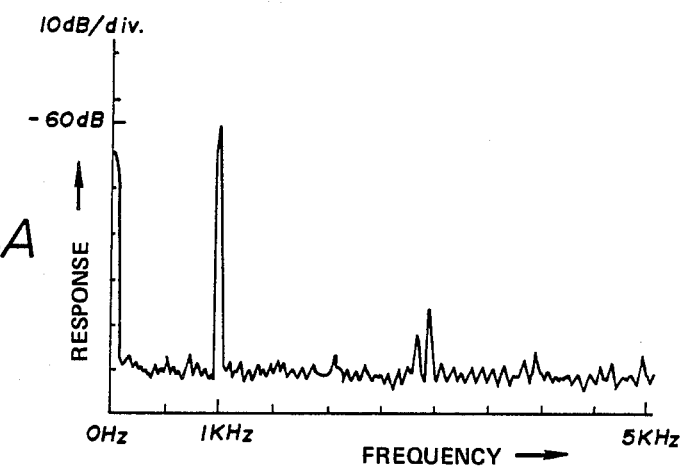

FIGS. 23 and 24 represent the frequency spectra of the decoder output, wherein FIG. 23 indicates the case in which preferential filter selection processing is performed in accordance with the present invention and FIG. 24 the case in which processing is not performed (comparative example). In both of these cases, the operating word length is designed with an allowance of 6 lower platce side bits. In these figures, A, B and C represent the cases in which 1 kHz input signal is applied at −60 DB, a 1 kHz input signal is applied at −80 dB and no input signal is applied, respectively.

When the input signal level is changed in this manner, in the example of FIG. 23 in which the processing of the present invention is performed, first- and second-degree differential modes are selected in response to the −60 dB−1 kHz input at A, while only the straight PCM mode is selected in response to the −80 dB−1 kHz input at B and no input signal at C. On the contrary, in the comparative example of FIG. 24 in which the processing is not performed, first- and second-degree differential modes are selected in response to −60 dB−1 kHz input signal at A, a first-degree differential mode is selected in response to −80 dB−1 kHz input at B and a second-degree differential mode is selected in response to no input signal at C.

Figure 24B:
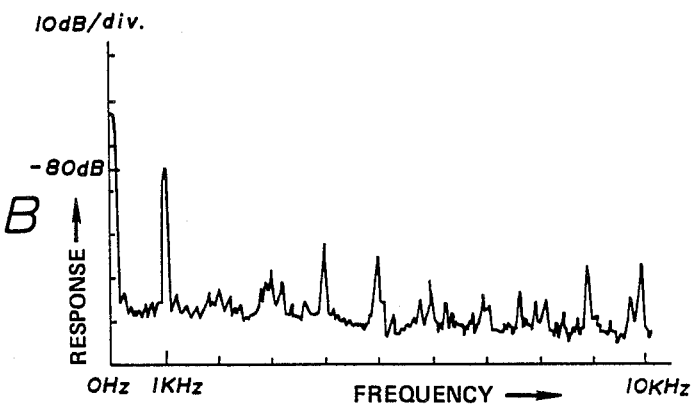
Figure 24C:
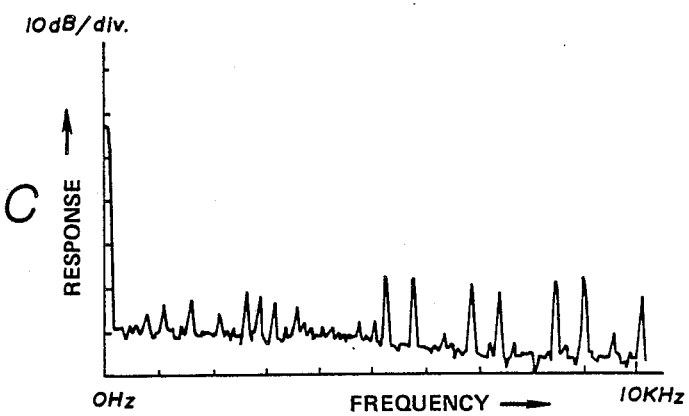

On comparison of FIGS. 23 and 24, it is seen that, during the time the extremely low level signal to no signal is introduced, the S/N ratio in FIGS. 23B and 23C in accordance with the present invention is obviously improved over that in FIGS. 24B and 24C of the comparative example. Above all, when there is no input signal, the noise level in the overall range in FIG. 24C is as large as −89.7 dB, whereas that in FIG. 23C is kept at a lower level of −93.6 dB thus indicating effect in improving the S/N ratio.

According to the above described fourth embodiment of the present invention, the lower degree filter with a smaller estimated gain is more apt to be selected when the input signal is at an extremely low level, so that the noise resulting from the limitation in the operating word length in the case of using the higher degree filters with the larger gain may be reduced to a smaller value. Because of the increased rate of selection of the lower degree filters, the effect of invulnerability to code error is simultaneously achieved. In addition, since the number of the lower place side allowance bits of the operating word length in at least the decoder side filter may be reduced, the decoder circuit can be simplified in structure.

It is to be noted that the present invention is not limited to the above embodiments. Thus the sampling frequency of the input digital signals, the number of bits in one word or in one block, the number of kinds or the number of maximum degrees of the filter, or the number of re-quantizing bits, for example, can be selected as desired.

We claim:

1. In a digital signal transmission device having means for forming serial input digital signals into a block after each predetermined number of words, the combination comprising;
    a filter unit connected to receive said digital signals and adapted to obtain an estimated error for the signals of each block,
    said filter unit consisting of a plurality of filters having a multiplier for multiplying one of a plurality of coefficients for adjusting the response of said filter,
    means for comparing, with each other, the absolute values in the signals from said filters, and
    means for selecting a filter that gives the smallest of said maximum absolute values and for connecting the signals from the selected filters to an output terminal, said connected signals forming said block.

2. A digital signal transmission device according to claim 1, wherein said plurality of filters includes filters of different degree, and characterized in that, as a further condition imposed when selecting one of said filters, the maximum absolute values in the signals produced from the plurality of filters are compared with a predetermined constant value Lo and the filter of the lowest degree is selected from among the filters outputting the maximum absolute values that are smaller than said value Lo.

3. A digital signal transmission device according to claim 1, wherein said input digital signals comprise PCM data and at least one of said filters is designed to output substantially straight PCM data.

4. A digital signal transmission device according to claim 1, including means for requantizing signals from the selected filter and means for feeding back and noise-shaping the quantization error to the input of said requantizing means, means for multiplying the maximum absolute value of the signal in the block from the selected filter by one or more coefficients, and means for determining the position for omitting said requantization bits on the basis of the results of said multiplication.

5. A digital signal transmission device according to claim 1, including means for requantizing signals produced from the selected filter, means for feeding back the quantization error to the input of said requantizing and as subjecting the thus fed back error to noise-shaping, the positions of omitting requantization bits at the time of requantization being determined on the basis of maximum absolute value of the signals in the block produced from the selected filter, while a limitation is placed on the shifting towards the least significant bits of the positions of omitted requantization bits.

6. A digital signal transmission device according to claim 1, including means for requantizing signals from the selected filter, means for feeding back the quantization error to the input of said requantizing means and subjecting the feed back quantization error to noise-shaping, means for determining the positions of omitted the requantization bits at the time of requantization on the basis of the maximum absolute value of the signal in the block produced by the selected filter, and means for clipping to the positive or negative maximum values on occurrence of overflow of the requantization data.

* * * * *